United States Patent
Ohkuni et al.

(10) Patent No.: US 6,187,688 B1
(45) Date of Patent: Feb. 13, 2001

(54) PATTERN FORMATION METHOD

(75) Inventors: Mitsuhiro Ohkuni, Nara; Shunsuke Kugo, Nagaokakyo; Tomoyuki Sasaki, Uji; Kenji Tateiwa, Osaka; Hideo Nikoh, Otsu, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/142,252

(22) PCT Filed: Dec. 4, 1997

(86) PCT No.: PCT/JP97/04455

§ 371 Date: Sep. 18, 1998

§ 102(e) Date: Sep. 18, 1998

(87) PCT Pub. No.: WO98/32162

PCT Pub. Date: Jul. 23, 1998

(30) Foreign Application Priority Data

Jan. 21, 1997 (JP) .................................. 9-008253
Jul. 15, 1997 (JP) .................................. 9-189579
Jul. 15, 1997 (JP) .................................. 9-189581

(51) Int. Cl.[7] .................................. H01L 21/00

(52) U.S. Cl. ................ 438/725; 438/735; 216/67; 216/72

(58) Field of Search .................. 216/47, 49, 67, 216/72; 438/719–721, 725, 734, 735

(56) References Cited

U.S. PATENT DOCUMENTS

| 4,581,101 | * | 4/1986 | Senoue et al. | 156/643 |
| 5,447,598 | * | 9/1995 | Mihara et al. | 216/46 |
| 5,804,088 | * | 9/1998 | McKee | 216/47 |

* cited by examiner

*Primary Examiner*—Bruce Breneman
*Assistant Examiner*—Alva C. Powell
(74) *Attorney, Agent, or Firm*—McDermott, Will & Emery

(57) ABSTRACT

After an organic bottom anti-reflective coating (12) is deposited on an underlying film (11), a resist pattern (15) is formed on the organic bottom anti-reflective coating (12). Dry etching is performed with respect to the organic bottom anti-reflective coating (12) masked with the resist pattern (15) to form an anti-reflective coating pattern. The dry-etching of the organic bottom anti-reflective coating (12) is performed by using etching gas containing gas having the S component such as $SO_2/O_2$-based etching gas or $COS/O_2$-based etching gas.

13 Claims, 22 Drawing Sheets

PATTERN FORMATION METHOD

TECHNICAL FIELD

The present invention relates to a pattern formation method for forming a resist pattern composed of a resist film. More particularly, it relates to the technique of performing dry etching with respect to an organic bottom anti-reflective coating deposited under the resist film by using the resist pattern as a mask.

BACKGROUND ART

With the increasing miniaturization of a semiconductor integrated circuit element in recent years, exposing light with a shorter wavelength has been used in a lithographic step. At present, the use of a KrF excimer laser (with a wavelength of 248 nm) or the like is becoming prevalent.

As the wavelength of exposing light becomes shorter, the reflectivity of light reflected from a substrate after exposing a resist film becomes higher so that the reflected light from the substrate is more likely to cause variations in the size of a resist pattern. The variations in the size of the resist pattern are produced as follows. After exposing the resist film, the light is reflected from the substrate underlying the resist film and incident again on the resist film to re-expose the resist film including a portion which should not be exposed.

To prevent the reflected light from being incident on the resist film, there has recently been proposed a process wherein an organic anti-reflection coating (hereinafter simply referred to as ARC in tables and drawings) is formed under the resist film. The process is primarily used in the manufacturing of a semiconductor element in a high-performance device with design rules whereby a gate width is 0.25 µm or less.

Referring to FIGS. 1(a) to 1(e), a method of forming a resist pattern by using an organic bottom anti-reflective coating will be described.

First, as shown in FIG. (1a), an organic bottom anti-reflective coating 12 is deposited on an underlying film 11 (such as a polysilicon film, a silicon oxide film, or a tungsten silicide film) to have a flat surface. Then, as shown in FIG. 1(b), a resist film 13 composed of a positive resist is deposited on the organic bottom anti-reflective coating 12.

Next, as shown in FIG. 1(c), selective exposure of the resist film 13 is performed by using a mask 14. Subsequently, developing treatment is performed with respect to the exposed resist film 13 to remove the exposed portion thereof, thereby forming a resist pattern 15 shown in FIG. 1(d).

Next, as shown in FIG. 1(e), dry etching is performed with respect to the organic bottom anti-reflective coating 12 masked with the resist pattern 15, thereby removing the portion of the organic bottom anti-reflective coating 12 uncovered with the resist pattern 15.

However, the pattern formation method using the organic bottom anti-reflective coating 12 as described above presents problems during dry etching performed with respect to the organic bottom anti-reflective coating 12, which are easily produced variations in the size of the organic bottom anti-reflective coating 12, low selectivity of the organic bottom anti-reflective coating 12 to the underlying film 11, and an increased number of particles generated in a reaction chamber in which etching is performed.

As for the problem of easily produced variations in the size of the organic bottom anti-reflective coating 12, the cause thereof may be simultaneous etching of the resist pattern 15 with the etching of the organic bottom anti-reflective coating 12 since the resist pattern 15 is made of a carbon-based material, similarly to the organic bottom anti-reflective coating 12.

As for the problem of an increased number of particles generated in the reaction chamber, the cause thereof may be particles generated from the organic bottom anti-reflective coating 12 during the etching of the organic bottom anti-reflective coating 12.

To solve each of the above problems, there has been proposed the use of $HBr/O_2$-based gas and $N_2/O_2$-based gas as etching gas for the organic bottom anti-reflective coating 12.

On the other hand, it has recently been reported that the use of $Cl_2/O_2$-based gas as etching gas for the organic bottom anti-reflective coating 12 improves size controllability and maximizes the selectivity to a polysilicon film as the underlying film (NEC: Nishizawa et al., the 57th Applied Physics Scientific Lecture Meeting (Autumn 1996), No.2 p.483,7a-T-1). It has also been reported that the use of $CO/N_2/O_2$-based gas as etching gas for the organic bottom anti-reflective coating 12 improves the selectivity to the resist film (LGSemicon: Jeon et al., the 57th Applied Physics Scientific Lecture Meeting (Autumn 1996), No.2 p.522, 8a-T-7).

(Problem Caused by Etching Using $Cl_2/O_2$-Based Gas)

The present inventors performed dry etching with respect to the organic bottom anti-reflective coating 12 by using $Cl_2/O_2$-based gas and encountered another problem, which will be described below.

A description will be given to a method of dry etching performed with respect to an organic bottom anti-reflective coating by using $Cl_2/O_2$-based gas. Although a dry-etching apparatus can be selected from various etching apparatus, the description will be given to the case where dry etching was performed by using a first etching apparatus shown in FIG. 2.

The first etching apparatus comprises a grounded chamber 21 having an inner wall covered with an insulator such as ceramic, alumina, or quartz.

An inner circumferential wall of the chamber 21 is provided with a first lateral electrode 22A, a second lateral electrode 22B, and a third lateral electrode 22C, which are equally spaced therearound. The first, second, and third lateral electrodes 22A, 22B, and 22C receive respective supplies of high-frequency power of 54.24 MHz from a first high-frequency power source 23A, a second high-frequency power source 23B, and a third high-frequency power source 23C via a matching circuit not shown. The supplies of high-frequency power are equal in discharge power but progressively shifted in phase by approximately 120°. Specifically, the phase of high-frequency power supplied to the second lateral electrode 22B is 120° leading the phase of high-frequency power supplied to the first lateral electrode 22A and the phase of high-frequency power supplied to the third lateral electrode 22C is 120° lagging behind the phase of high-frequency power supplied to the first lateral electrode 22A. It is to be noted that a phase shifter not shown produces a 120° phase shift between the supplies of high-frequency power from each adjacent two of the first to third high-frequency power sources 23A to 23C.

An earth electrode 24 is disposed on the inner bottom portion of the chamber 21. A sample stage 25 serving as a lower electrode for holding a substrate is provided on the earth electrode 24. A bias high-frequency voltage is applied from a fourth high-frequency power source 26 to the sample stage 25.

The chamber 21 is provided with a gas inlet for introducing etching gas into the chamber 21 via a mass flow controller and with a turbo pump for adjusting pressure in the chamber 21 to be about 0.1 to 10 Pa, though they are not shown in the drawings.

A description will be given below to a method of dry etching performed with respect to the organic bottom anti-reflective coating by using the first etching apparatus with reference to FIGS. 4(a) and 4(b).

First, as shown in FIG. 4(a), a silicon oxide film 42 is thermally grown on a silicon wafer 41, followed by a polysilicon film 43 deposited as an underlying film on the thermally grown silicon oxide film 42. Thereafter, an organic bottom anti-reflective coating 44 with a film thickness of 150 nm and a resist film are deposited sequentially on the polysilicon film 43. Then, etching is performed with respect to the resist film to form a resist pattern 45 composed of the resist film.

Next, as shown in FIG. 4(b), dry etching is performed with respect to the organic bottom anti-reflective coating 44 masked with the resist pattern 45. Conditions for the dry-etching process are as shown in Table 1.

In Table 1, LEP (Lissajous Electron Plasma) denotes the frequencies and power of high-frequency power for plasma generation supplied from the first to third high-frequency power sources 23A, 23B, and 23C and RF (Radio Frequency) denotes the frequency and power of the bias high-frequency power supplied from the fourth high-frequency power source 26. The denotations of LEF and RF remain the same in the following description and tables showing the conditions for the etching process.

TABLE 1

CONDITIONS FOR ETCHING PROCESS

| | |
|---|---|
| $Cl_2/O_2$ | 20/20 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | −5 (° C.) |

The results of etching are as shown in Table 2. After etching, the organic bottom anti-reflective coating 44 exhibited vertical profiles, an excellent size-varying property, and high selectivity to the polysilicon film 43. In Table 2, "open" denotes a wiring pattern area in which a space forming a line-and-space pattern has a width of about 1 $\mu$m or more and "dense" denotes a wiring pattern area in which a space forming a line-and-space pattern has a width of about 0.3 $\mu$m. The denotations of "open" and "dense" remain the same in the following description and tables showing the conditions for the etching process.

TABLE 2

ETCHING PROPERTIES

| | |
|---|---|
| ARC ETCH RATE | 1600 (Å/min) |
| UNIFORMITY | ±2.0 (%) |
| SIZE VARIATION | −0.02 $\mu$m (open) |
| | −0.05 $\mu$m (dense) |
| SELECTIVITY TO POLYSILICON FILM | ∞ |
| ROUGHNESS OF POLYSILICON FILM | PRESENT |
| NUMBER OF GENERATED PARTICLES | SMALL |

In a surface region of the silicon wafer 41, especially the region where the resist pattern 45 has an aperture small in area (dense area), the polysilicon film 43 underlying the organic bottom anti-reflective coating 44 is also etched, so that surface roughness is observed at the polysilicon film 43. When etching performed with respect to the organic bottom anti-reflective coating 44 has thus caused surface roughness at the polysilicon film 43, roughness remains on the polysilicon film 43 formed into a pattern, which presents a serious problem to practical applications.

(Problem Caused by Etching Using $N_2/O_2$-Based Gas)

The present inventors also performed dry etching with respect to the organic bottom anti-reflective coating by using $N_2/O_2$-based gas and encountered still another problem, which will be described below. A description will be given to a method of etching performed with respect to the organic bottom anti-reflective coating by using $N_2/O_2$-based gas. Although a dry-etching apparatus can be selected from various etching apparatus, the description will be given to the case where dry etching was performed by using a second etching apparatus shown in FIG. 3.

The second etching apparatus comprises a grounded chamber 31 having an inner wall covered with an insulator such as ceramic, alumina, or quartz. In the chamber 31, an inductively coupled coil 32 is disposed in the upper part thereof, while a sample stage 33 is disposed on an earth electrode 34 in the lower part thereof. One end of the inductively coupled coil 32 receives high-frequency power of 13.56 MHz applied thereto from a first high-frequency power supply 35 via a matching circuit not shown. The sample stage 33 receives high-frequency power of 13.56 MHz applied thereto from a second high-frequency power supply 36. The other end of the inductively coupled coil 32 is connected to the sidewall of the chamber 31 and thereby grounded. The chamber 31 is provided with a gas inlet for introducing etching gas into the chamber 31 via a mass flow controller and with a turbo pump for adjusting pressure in the chamber 31 to about 0.1 to 10 Pa, though they are not shown in the drawings.

A description will be given below to a method of dry etching performed with respect to the organic bottom anti-reflective coating by using the second etching apparatus with reference to FIGS. 4(a) and 4(b).

First, as shown in FIG. 4(a), a silicon oxide film 42 is thermally grown on a silicon wafer 41, followed by a polysilicon film 43 deposited as an underlying film on the thermally grown silicon oxide film 42. Thereafter, an organic bottom anti-reflective coating 44 with a film thickness of 150 nm and a resist film are deposited sequentially on the polysilicon film 43. Then, etching is performed with respect to the resist film to form a resist pattern 45 composed of the resist film.

Next, as shown in FIG. 4(b), dry etching is performed with respect to the organic bottom anti-reflective coating 44 masked with the resist pattern 45. Conditions for the dry-etching process are as shown in Table 3. In Table 3, ICP (Inductively Coupled Plasma) denotes the frequency and power of high-frequency power for plasma generation supplied from the first high-frequency power supply 35. The denotation of ICP remains the same in the following description and tables showing the conditions for the etching process. The results of etching are as shown in Table 4. After etching, the organic bottom anti-reflective coating 44 exhibited vertical profiles, an excellent size-varying property, and high selectivity to the polysilicon film 43, as can be understood from Table 4.

TABLE 3

CONDITIONS FOR ETCHING PROCESS

| | |
|---|---|
| $N_2/O_2$ | 20/20 (sccm) |
| ICP/RF | 13.56 (MHz) |
| | 300/70 (W) |
| PRESSURE | 5 (mTorr) |
| TEMPERATURE OF LOWER ELECTRODE | 10 (° C.) |

TABLE 4

ETCHING PROPERTIES

| | |
|---|---|
| ARC ETCH RATE | 1600 (Å/min) |
| UNIFORMITY | ±2.0 (%) |
| SIZE VARIATION | −0.04 μm (open) |
| | −0.06 μm (dense) |
| SELECTIVITY TO POLYSILICON FILM | ∞ |
| FOREIGN RESIDUE | PRESENT |

After dry etching, the silicon wafer 41 as a target substrate was visually inspected in the dark field under a microscope and a large number of (about 100 residues per 3 mm²) were observed. Such foreign residues resulting from etching performed with respect to the organic bottom anti-reflective coating 44 present a serious problem to practical applications, since the foreign residues are transferred to the polysilicon film 43 while it is etched in the subsequent step.

In view of the foregoing, it is therefore a first object of the present invention to pattern an organic bottom anti-reflective coating by dry etching such that the patterned organic bottom anti-reflective coating exhibits vertical profiles, an excellent size-varying property, and high selectivity to the underlying film, while no surface roughness is observed at the underlying film. A second object of the present invention is to pattern an organic bottom anti-reflective coating by dry etching such that the patterned organic bottom anti-reflective coating exhibits vertical profiles, an excellent size-varying property, and high selectivity to the underlying film, while no foreign residue is produced.

DISCLOSURE OF THE INVENTION (Means for Attaining First Object)

As a result of tracking down the cause of surface roughness observed at the polysilicon film as the underlying film in a surface region of the silicon wafer where the aperture of the resist pattern occupies a small area, the present inventors have found the following fact. FIG. 21 is a plan view of the resist pattern overlying the region with surface roughness of the polysilicon film as the underlying film. As shown in FIG. 21, the three sides of the resist pattern having an L-shaped configuration define a narrow region where the spacing between the opposed sides is 0.3 μm. In the narrow region, the polysilicon film as the underlying film is covered with the organic bottom anti-reflective coating before dry etching is performed with respect to the organic bottom anti-reflective coating by using $Cl_2/O_2$-based etching gas. FIG. 21 shows a plan view at the stage at which the etching of the organic bottom anti-reflective coating is completed.

When dry etching is performed by using $Cl_2/O_2$-based etching gas and the resist pattern as shown in FIG. 21 as a mask, the narrow region with a 0.3-μm width is surrounded by the resist pattern so that an $O_2$ component of $Cl_2/O_2$-based gas reacts with C composing the resist film. Consequently, an excessive amount of $Cl_2$ component is contained in etching gas in the narrow region surrounded by the resist pattern.

If consideration is given to $Cl_2$-based gas, it etches not only the organic bottom anti-reflective coating but also the polysilicon film since $Cl_2$-based gas is halogen-based gas. In the narrow region surrounded by the resist pattern, therefore, not only the organic bottom anti-reflective coating but also the polysilicon film as the underlying film is etched, resulting in surface roughness observed at the polysilicon film in the narrow region surrounded by the resist pattern.

It is to be noted that the foregoing problem also occurs when the underlying film is composed of a silicon-based film since the $Cl_2/O_2$-based etching gas also etches a silicon-based underlying film such as an amorphous silicon film, a polysilicon film, or a tungsten silicide film besides the polysilicon film.

The foregoing is first knowledge obtained by the present inventors from an experiment conducted by using $Cl_2/O_2$-based etching gas.

(Means for Attaining Second Object)

As a result of analyzing foreign residues by ESCA (Electron Spectroscopy for Chemical Analysis), the present inventors have found that the foreign residues contain silicon as the main component.

Then, the material of the organic bottom anti-reflective coating (CD9™ commercially available from Brewer Science Co., U.S.A.) in use was analyzed for an inorganic component by emission spectral analysis and a silicon component on the order of 10 ppm was detected from the material of the organic bottom anti-reflective coating.

If consideration is given to $N_2/O_2$-based gas, it is capable of etching the organic component of the organic bottom anti-reflective coating but incapable of etching the silicon-based component. If an impurity of silicon is contained in the organic bottom anti-reflective coating, silicon contained therein remains without being etched away and the remaining silicon may serve as a source of the foreign residues.

The foregoing is second knowledge obtained by the present inventors from an experiment conducted by using $N_2/O_2$-based etching gas.

A first pattern formation method according to the present invention has been achieved based on the foregoing first knowledge and comprises: a first step of depositing an organic bottom anti-reflective coating on an underlying film formed on a substrate; a second step of forming a resist pattern on the organic bottom anti-reflective coating; and a third step of performing dry etching with respect to the organic bottom anti-reflective coating masked with the resist pattern to form an anti-reflective coating pattern composed of the organic bottom anti-reflective coating, wherein the third step includes the step of performing dry etching by using etching gas containing gas having a S component to form the anti-reflective coating pattern.

In accordance with the first pattern formation method, the S component contained in etching gas has a low probability of reacting with Si so that etching gas will not etch the underlying film containing Si such as the polysilicon film formed under the organic bottom anti-reflective coating nor cause local surface roughness at the underlying film.

Moreover, since the S component contained in etching gas combines with C as the main component of each of the resist pattern and the organic bottom anti-reflective coating to form C–S bonds, which are attached to the respective pattern sidewalls of the resist pattern and the organic bottom anti-reflective coating and thereby protect the pattern sidewalls, the organic bottom anti-reflective coating has an excellent size-varying property after etching.

In the first pattern formation method, the etching gas used in the third step is preferably $SO_2/O_2$-based gas.

In the arrangement, the adjustment of the ratio of $O_2$ to $SO_2$ in etching gas facilitates control of the size-varying property of the organic bottom anti-reflective coating after etching.

In this case, a ratio of $O_2$ to $SO_2$ in the $SO_2/O_2$-based gas is preferably ½ or more.

The arrangement prevents the organic bottom anti-reflective coating from being larger in size than the resist pattern after etching.

In the first pattern formation method, the third step preferably includes the step of performing dry etching with the substrate held at a temperature of 15° C. or lower to form the anti-reflective coating pattern.

The arrangement improves the size-varying property of the organic bottom anti-reflective coating after etching.

In the first pattern formation method, the etching gas used in the third step preferably contains carbonyl sulfide (COS).

The arrangement facilitates the handling of COS since COS is less likely to liquidify than $SO_2$.

A second pattern formation method according to the present invention has been achieved based on the foregoing first knowledge and comprises: a first step of depositing an organic bottom anti-reflective coating on an underlying film formed on a substrate; a second step of forming a resist pattern on the organic bottom anti-reflective coating; and a third step of performing dry etching with respect to the organic bottom anti-reflective coating masked with the resist pattern to form an anti-reflective coating pattern composed of the organic bottom anti-reflective coating, wherein the third step includes: a pattern forming step of performing dry etching by using etching gas containing gas having a S component to form the anti-reflective coating pattern; and a S-component removing step of removing the S component remaining on the substrate.

In accordance with the second pattern formation method, the S component contained in etching gas has a low probability of reacting with Si, similarly to the first pattern formation method, so that etching gas will not etch the underlying film containing Si such as the polysilicon film formed under the organic bottom anti-reflective coating nor cause local surface roughness at the underlying film.

Moreover, since the S component contained in etching gas combines with C as the main component of each of the resist pattern and the organic bottom anti-reflective coating to form C–S bonds, which are attached to the respective pattern sidewalls of the resist pattern and the organic bottom anti-reflective coating and thereby protect the pattern sidewalls, the organic bottom anti-reflective coating exhibits an excellent size-varying property after etching.

Furthermore, since the S component generated from etching gas containing gas having the S component is removed, the S component remaining on the substrate is prevented from reacting with moisture contained in the atmosphere to form residues and causing a defective pattern configuration of the underlying film.

In the second pattern formation method, the S-component removing step preferably includes the step of performing plasma processing by using a plasma composed of gas containing no S component to remove the S component.

In the arrangement, plasma processing ensures the removal of the S component.

The plasma processing is preferably performed by an anode coupling system or by a system whereby no bias voltage is applied to an electrode holding the substrate.

In the arrangement, an excessive amount of $N^+$ ion component no more stagnates in the upper portion of the resist pattern so that pattern collapse resulting from the No ion component sputtering the upper portion of the resist pattern is prevented.

The plasma processing more preferably includes the step of setting a condition for plasma processing composed of at least one of gas pressure, a gas flow rate, temperature, high-frequency output, and a processing time in accordance with the degree of ruggedness of a surface of the underlying film and with the type of the underlying film. This ensures the removal of the S component remaining on the substrate.

In the second pattern formation method, the S-component removing step preferably includes the step of heating the substrate to remove the S component.

The arrangement allows the evaporation of the residues containing the S component remaining on the substrate and thereby ensures the removal of the S component remaining on the substrate.

In the second pattern formation method, the S-component removing step preferably includes the step of washing the substrate to remove the S component.

The arrangement facilitates and ensures the removal of the S component remaining on the substrate.

In the second pattern formation method, the S-component removing step preferably includes the step of neutralizing an acidic deposit on the substrate with an alkaline solution and washing the substrate to remove the S component.

The arrangement neutralizes and dissolves the deposit containing the S component remaining on the substrate such that the deposit is washed away positively.

A third pattern formation method according to the present invention has been achieved based on the foregoing second knowledge and comprises: a first step of depositing an organic bottom anti-reflective coating on an underlying film formed on a substrate; a second step of forming a resist pattern on the organic bottom anti-reflective coating; and a third step of performing dry etching with respect to the organic bottom anti-reflective coating masked with the resist pattern to form an anti-reflective coating pattern composed of the organic bottom anti-reflective coating, wherein the third step includes the step of performing dry etching with respect to the organic bottom anti-reflective coating by using etching gas containing at least one of halogen-based gas and fluorocarbon-based gas to form the anti-reflective coating pattern when silicon is contained in the organic bottom anti-reflective coating.

In accordance with the third pattern formation method, etching gas containing at least one of halogen-based gas and fluorocarbon-based gas is capable of etching the organic component of the organic bottom anti-reflective coating as well as an impurity such as silicon contained in the organic bottom anti-reflective coating. What results is an organic bottom anti-reflective coating formed into a pattern having vertical profiles. Since an impurity such as unreacted silicon no more remains on the substrate, foreign residues composed of an impurity such as silicon are prevented from being formed on the substrate.

BEST MODES FOR IMPLEMENTING THE INVENTION

Prior to the description of pattern formation methods according to the individual embodiments of the present invention, a description will be given to a pattern formation process commonly used in each of the embodiments with reference to FIGS. 1(a) to 1(e).

Figure 1A:
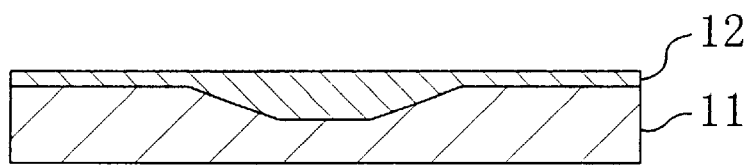
FIGS. 1(a) to 1(e) are cross-sectional views illustrating individual process steps in a pattern formation method according to each of the embodiments of the present invention and prior art.
Figure 1B:
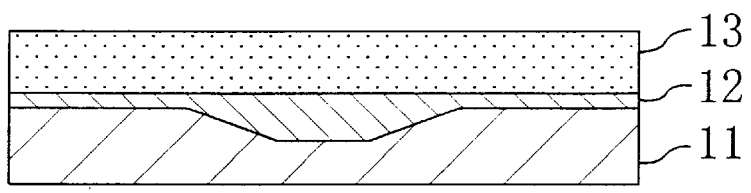

First, as shown in FIG. 1(a), an organic bottom anti-reflective coating 12 is deposited on an underlying film 11 composed of a polysilicon film to have a flat surface. Then, as shown in FIG. 1(b), a resist film 13 composed of a positive resist is deposited on the organic bottom anti-reflective coating 12.

Figure 1C:
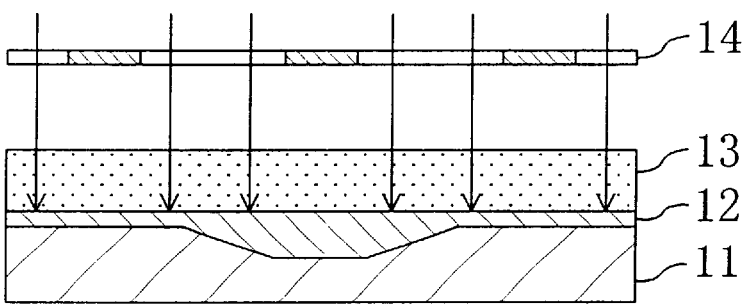
Figure 1D:
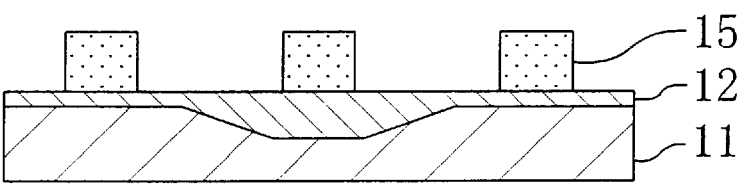

Next, as shown in FIG. 1(c), selective exposure of the resist film 13 is performed by using a mask 14. Subsequently, developing treatment is performed with respect to the exposed resist film 13 to remove the exposed portion thereof, thereby forming a resist pattern 15 shown in FIG. 15(d).

Figure 1E:
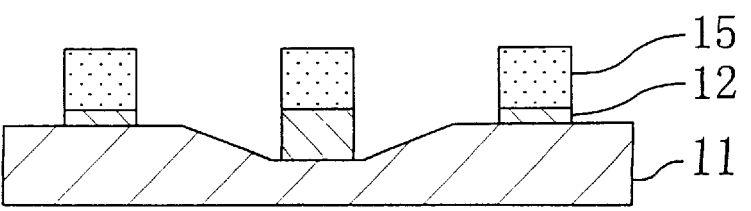

Next, as shown in FIG. 1(e), dry etching is performed with respect to the organic bottom anti-reflective coating 12 masked with the resist pattern 15, thereby removing the portion of the organic bottom anti-reflective coating 12 uncovered with the resist pattern 15.

EMBODIMENT 1

A first embodiment has been achieved based on the foregoing first knowledge. Specifically, the first embodiment performs dry etching with respect to the organic bottom anti-reflective coating by using $SO_2/O_2$-based etching gas.

Figure 2:
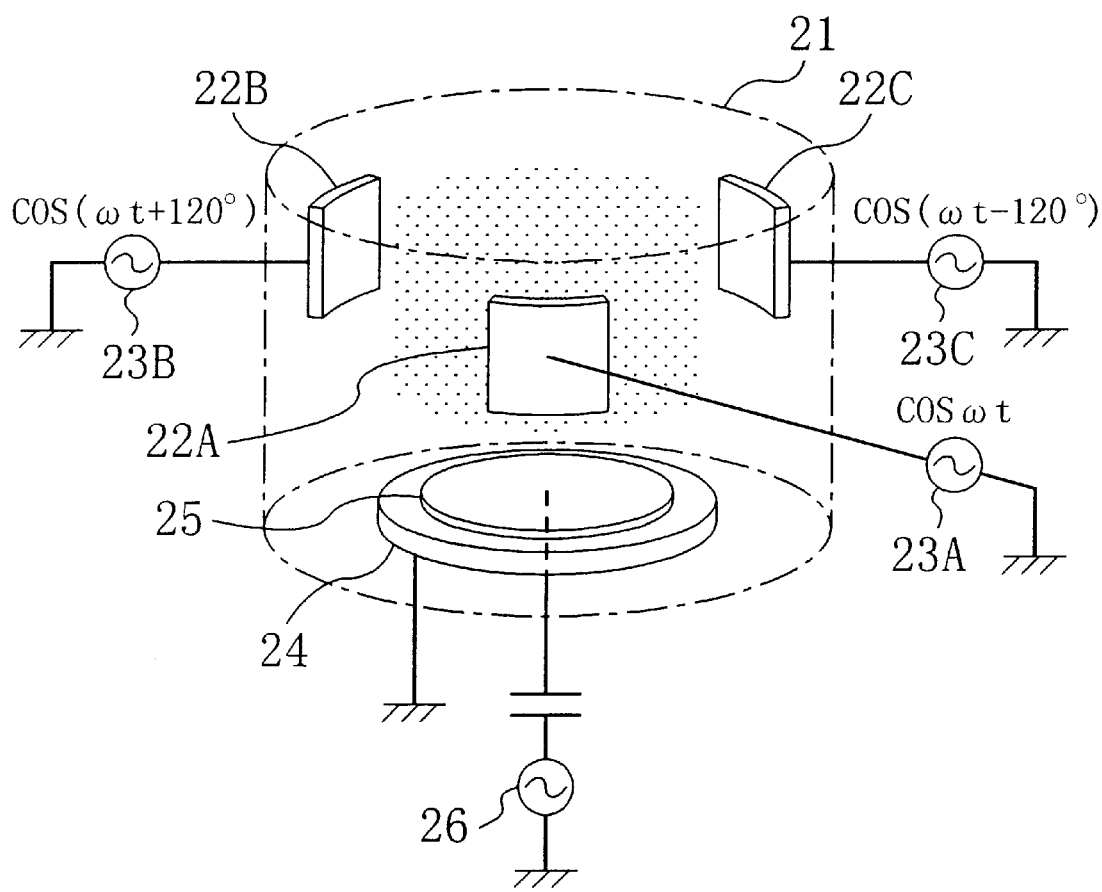
FIG. 2 is a schematic view of a first etching apparatus used by the pattern formation method according to each of the embodiments of the present invention and prior art.

Although an apparatus for performing dry etching does not present a particular problem, the first dry etching apparatus shown in FIG. 2 was used for comparison. A film having the structure shown in FIG. 4 was used as a target film.

Conditions for the etching process according to the first embodiment are as shown in Table 5 and etching properties are as shown in Table 6. As will be understood from Table 6, the organic bottom anti-reflective coating exhibited vertical profiles, though there were slight variations in the size of the organic bottom anti-reflective coating. Moreover, surface roughness caused conventionally by dry etching using $Cl_2/O_2$-based gas was no more observed at the polysilicon film 43 as the underlying film.

TABLE 5

CONDITIONS FOR ETCHING PROCESS

| | |
|---|---|
| $SO_2/O_2$ | 32/8 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | 20 (° C.) |

TABLE 6

ETCHING PROPERTIES

| | |
|---|---|
| ARC ETCH RATE | 2000 (Å/min) |
| UNIFORMITY | ±13.5 (%) |
| SIZE VARIATION | +0.05 μm (open) |
| | +0.06 μm (dense) |
| SELECTIVITY TO POLYSILICON FILM | ∞ |
| ROUGHNESS OF POLYSILICON FILM | NONE |
| NUMBER OF GENERATED PARTICLES | LARGE |

The vertical profiles exhibited by the organic bottom anti-reflective coating 44 may be attributed to the combination of a S component contained in the etching gas with C, which is the main component of each of the resist pattern 45 and the organic bottom anti-reflective coating 44. The resulting C-S bonds are attached to the respective sidewalls of the resist pattern 45 and the organic bottom anti-reflective coating 44 formed into the pattern, thereby protecting the sidewalls of the patterns.

No surface roughness observed at the polysilicon film 43 maybe attributed to a low probability of S reacting with Si. Even when the underlying film for the organic bottom anti-reflective coating 44 is composed of the polysilicon film 43, therefore, the S component will neither etch the polysilicon film 43 nor cause surface roughness at the polysilicon film 43.

EMBODIMENT 2

A second embodiment has been achieved based on the foregoing first knowledge. Specifically, the second embodiment performs dry etching with respect to the organic anti-reflective coating by using etching gas composed of a gas mixture of carbonyl sulfide (COS) and oxygen ($O_2$). Since the boiling point of COS is −50.2° C., COS liquidifies more readily than $SO_2$ (with a boiling point of −10.06° C.) and hence is easier to handle.

Although an apparatus for performing dry etching does not present a particular problem, the first dry etching apparatus shown in FIG. 2 was used for comparison. A film having the structure shown in FIG. 4 was used as a target film.

Conditions for the etching process according to the second embodiment are as shown in Table 7 and etching properties are as shown in Table 8.

TABLE 7

CONDITIONS FOR ETCHING PROCESS

| | |
|---|---|
| $COS/O_2$ | 20/20 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | 20 (° C.) |

TABLE 8

ETCHING PROPERTIES

| | |
|---|---|
| ARC ETCH RATE | 1800 (Å/min) |
| UNIFORMITY | ±3.0 (%) |
| SIZE VARIATION | −0.01 μm (open) |
| | −0.03 μm (dense) |
| SELECTIVITY TO POLYSILICON FILM | ∞ |
| ROUGHNESS OF POLYSILICON FILM | NONE |

As shown in Table 8, variations in the size of the organic bottom anti-reflective coating (Open Area: −0.01 μm, Dense Area: −0.03 μm) in the case of using $COS/O_2$-based gas are smaller than size variations (Open Area: −0.02 μm, Dense Area: −0.05 μm) in the case of using $Cl_2/O_2$-based gas shown in Table 2 and than size variations (Open Area: +0.05 μm, Dense Area: +0.06 μm) in the case of using $SO_2/O_2$-based gas shown in Table 6 according to the first embodiment.

When dry etching was performed by using $COS/O_2$-based etching gas, the organic bottom anti-reflective coating 44 exhibited vertical profiles after etching, while surface roughness previously observed after etching performed by using $Cl_2/O_2$-based gas was no more observed at the polysilicon film as the underlying film.

This may be because C and S contained in COS readily form C-S bonds, C-C bonds, or the like between COS and the resist pattern 45 and between COS and the organic bottom anti-reflective coating 44. The resulting bonds are attached as a deposit to the respective sidewalls of the resist pattern 45 and the organic bottom anti-reflective coating 44, thereby protecting the respective sidewalls of the resist pattern 45 and the organic bottom anti-reflective coating 44.

On the other hand, no surface roughness observed at the polysilicon film 43 may be attributed to a low probability of S reacting with Si. Even when the film underlying the organic bottom anti-reflective coating 44 is composed of the polysilicon film 43, therefore, S will neither etch the polysilicon film 43 nor cause surface roughness at the polysilicon film 43.

EMBODIMENT 3

The first embodiment performing dry etching with respect to the organic bottom anti-reflective coating 44 by using $SO_2/O_2$-based etching gas was disadvantageous in that slight variations were produced in the size of the organic bottom anti-reflective coating 44 and a large number of particles were generated, though no surface roughness was observed at the polysilicon film 43. Specifically, the organic bottom anti-reflective coating 44 after etching was larger in size than the resist pattern 45 and the number of generated particles was large, as shown in Table 6. If the organic bottom anti-reflective coating 44 after etching is larger in size than the resist pattern 45, etching performed in the subsequent step with respect the polysilicon film 43 by using the resist pattern 45 causes size variations in the patterned polysilicon film 43.

To overcome the disadvantage, the third embodiment has achieved the effects of preventing size variations in the organic bottom anti-reflective coating 44 and reducing the number of particles in addition to the effects achieved by the first embodiment. Specifically, the third embodiment controls the ratio of $O_2$ to $SO_2$ gas in $SO_2/O_2$-based etching gas.

In the third embodiment also, the first dry-etching apparatus shown in FIG. 2 was used and a film having the structure shown in FIG. 4 was used as a target film.

Conditions for the etching process according to the third embodiment are as shown in Table 9.

TABLE 9

| CONDITIONS FOR ETCHING PROCESS | |
|---|---|
| $SO_2/O_2$ | 20/X (sccm) |
| LEP/RF | 54.24/13.56 (MHz) |
| | 3 × 100/70 (W) |
| PRESSURE | 5 (mTorr) |
| TEMPERATURE OF LOWER ELECTRODE | −10 (° C.) |

In Table 9, X denotes the amount of $O_2$ gas contained in $SO_2/O_2$-based etching gas. A specific value of X will be described later.

Etching properties are as shown in Table 10. After etching, the organic bottom anti-reflective coating 44 had vertical profiles, an excellent size-varying property, and high selectivity to the polysilicon film 43. Since S radicals were adsorbed, reactivity of Si with S was significantly lower than reactivity of Si with Cl, so that no surface roughness was observed at the polysilicon film 43. Accordingly, the patterned polysilicon film 43 exhibited no surface roughness and presented no problem to practical applications. In the case where the flow rate of $O_2$ gas was 5 sccm and the lowest, no particle was generated.

TABLE 10

| ETCHING PROPERTIES | |
|---|---|
| ARC ETCH RATE | 1500 TO 2500 (Å/min) |
| UNIFORMITY | 14.0 (%) |
| SIZE VARIATION | −0.02 TO +0.01 μm (open) |
| | −0.03 TO +0.01 μm (dense) |
| SELECTIVITY TO POLYSILICON FILM | ∞ |
| ROUGHNESS OF POLYSILICON FILM | NONE |
| NUMBER OF GENERATED PARTICLES | SMALL |

Figure 5:
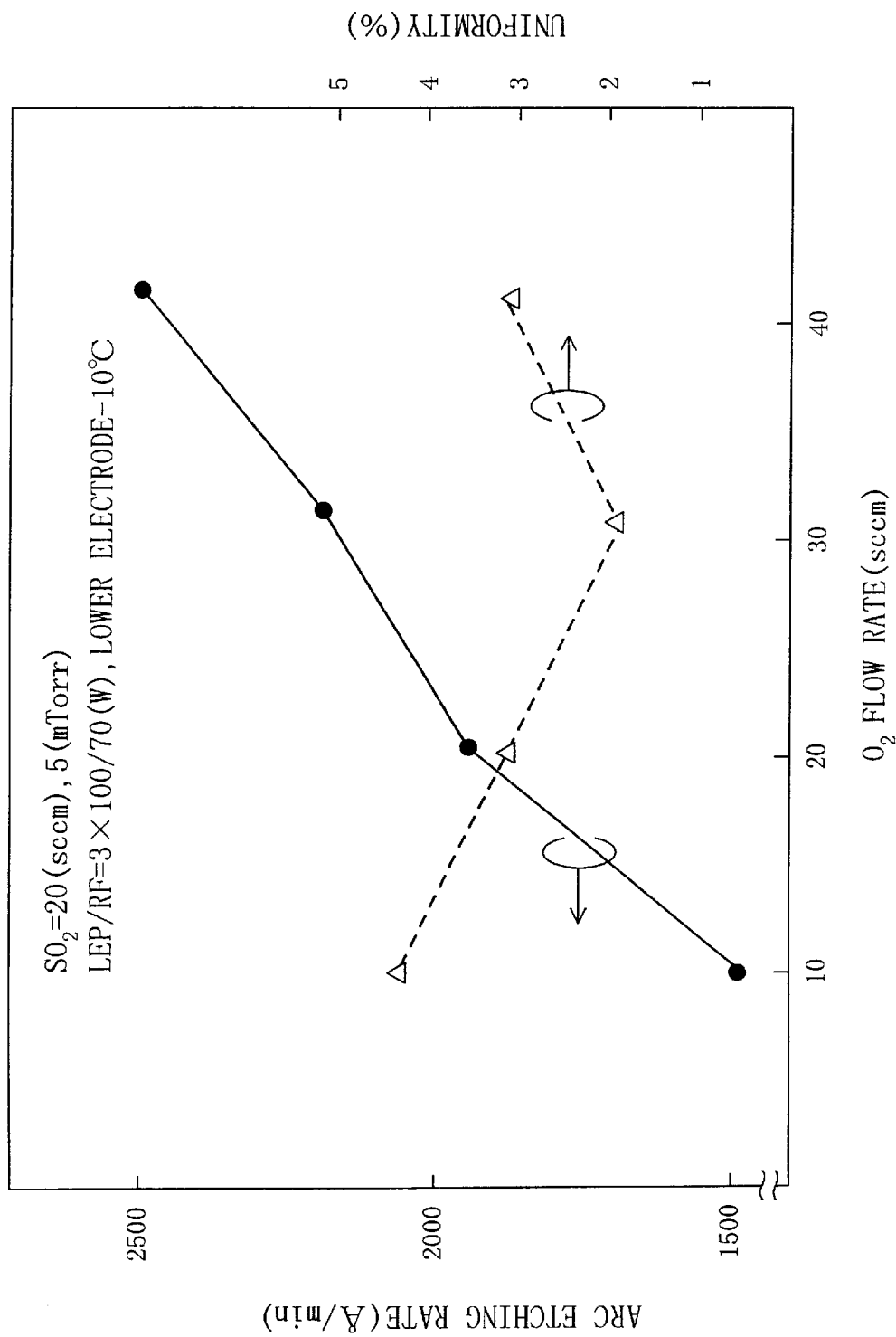
FIG. 5 shows the relations among the amount of $O_2$ gas contained in etching gas, an etching rate for an organic bottom anti-reflective coating, and the uniformity of film thickness in a pattern formation method according to a third embodiment of the present invention.
Figure 6:
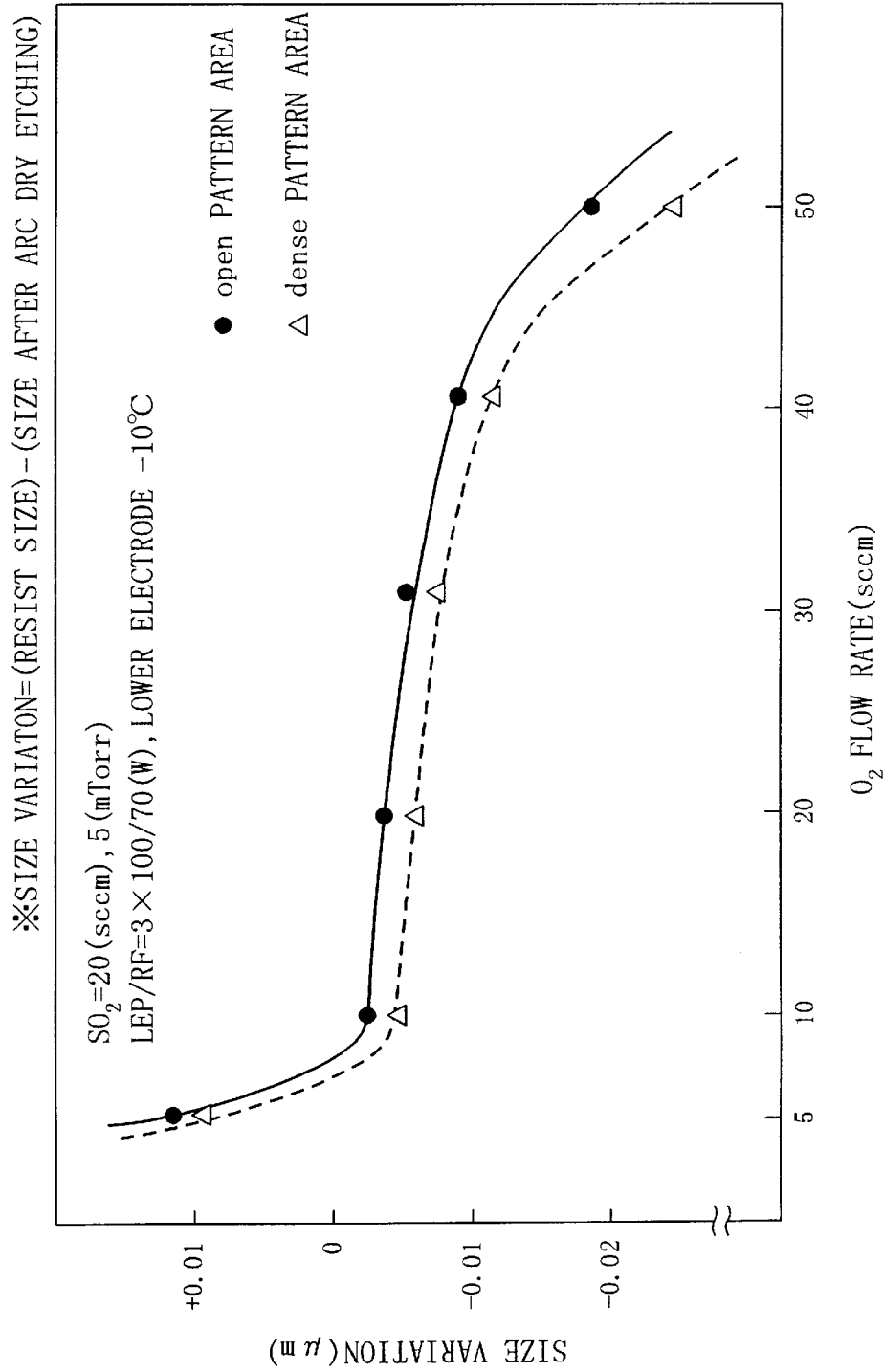
FIG. 6 shows the relation between the amount of $O_2$ gas contained in etching gas and respective size variations in open and dense pattern areas in the pattern formation method according to the third embodiment of the present invention.

FIG. 5 shows an etching rate for the organic bottom anti-reflective coating 44 and the uniformity of film thickness when various values were adopted as the amount X of $O_2$ gas in $SO_2/O_2$-based etching gas. FIG. 6 shows respective size variations in the open and dense pattern areas when various values were adopted as the amount X of $O_2$ gas in $SO_2/O_2$-based etching gas. As is apparent from FIG. 6, when the flow rate of $O_2$ gas was 10 sccm or higher, the organic bottom anti-reflective coating 44 after etching was never larger in size than the resist pattern 45. Since the problem of size variations does not occur provided that the flow rate of $O_2$ gas is 10 sccm or higher, i.e., the ratio of $O_2$ gas to $SO_2$ is ½ or more, the subsequent dry-etching processing using the resist pattern 45 can therefore be performed with precision.

The reason for positive size variations when the flow rate of $O_2$ gas is low (when the ratio of $O_2$ gas to $SO_2$ gas is low) in FIG. 6 may be that, after etching, a large number of S-C bonds are attached to the sidewalls of the organic bottom anti-reflective coating 44 due to vigorous reactions between S and C resulting from an increase in the ratio of the S component. On the other hand, the reason for negative size variations when the flow rate of $O_2$ gas is high (when the ratio of $O_2$ gas to $SO_2$ gas is high) in FIG. 6 may be that, after etching, S-C bonds are barely attached to the sidewalls of the organic bottom anti-reflective coating 44 due to stagnant reactions between S and C resulting from a reduction in the ratio of the S component.

EMBODIMENT 4

According to the third embodiment, an excellent size-varying property and high selectivity to the polysilicon film 43 were achieved. In addition, no surface roughness was observed at the polysilicon film 43 and no particle was generated. A fourth embodiment controls the temperature of the sample stage 25 as the lower electrode for holding a substrate so as to further improve the size-varying property. Specifically, the temperature of the sample stage 25 as the lower electrode is controlled under the conditions shown in the third embodiment, i.e., with $O_2$ gas in such a ratio that the organic bottom anti-reflective coating 44 after etching is never larger in size than the resist pattern 45.

In the fourth embodiment also, the first dry-etching apparatus shown in FIG. 2 was used and a film having the structure shown in FIG. 4 was used as a target film.

Conditions for the etching process according to the fourth embodiment are as shown in Table 11. A specific value of X, which denotes the temperature of the lower electrode, will be described later.

Etching properties are as shown in Table 12. After etching, the organic bottom anti-reflective coating 44 had vertical profiles and high selectivity to the polysilicon film 43. In addition, no surface roughness was observed at the polysilicon film 43 and the size-varying property was further improved.

TABLE 11

| CONDITIONS FOR ETCHING PROCESS | |
|---|---|
| $SO_2/O_2$ | 20/20 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | X (° C.) |

TABLE 12

| ETCHING PROPERTIES | |
|---|---|
| ARC ETCH RATE | 1800 TO 2000 (Å/min) |
| UNIFORMITY | 4.0 (%) or less |
| SIZE VARIATION | −0.03 TO 0.00 μm (open) |
| | −0.03 TO 0.00 μm (dense) |
| SELECTIVITY TO POLYSILICON FILM | ∞ |
| ROUGHNESS OF POLYSILICON FILM | NONE |
| NUMBER OF GENERATED PARTICLES | SMALL |

Figure 7:
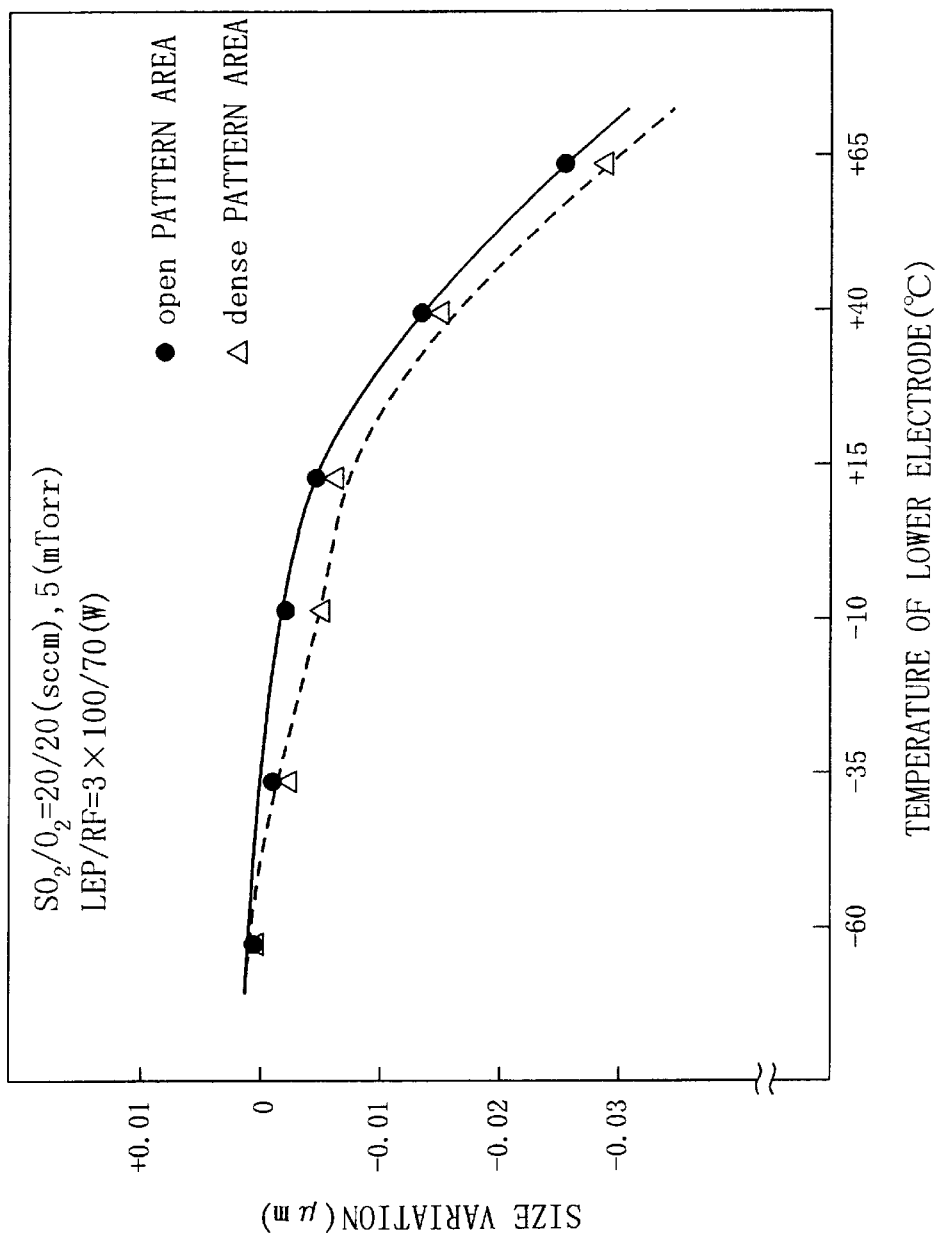
FIG. 7 shows the relation between the temperature of a lower electrode and respective size variations in open and dense pattern areas in a pattern formation method according to a fourth embodiment of the present invention.

FIG. 7 shows respective size variations in the open and dense areas when various values were adopted as the temperature X of the lower electrode.

As is apparent from FIG. 7, size variations tend to shift to the negative value range as the temperature X of the lower electrode increases. When the temperature X of the lower electrode is +65° C., in particular, size variations are on the order of −0.03 μm. This may be because, when the temperature X of the lower electrode is increased, C as the main component of each of the resist pattern 45 and the organic bottom anti-reflective coating 44 reacts with S as the etchant to form $CS_2$ gas, which is easy to discharge, and a deposit component in the form of a polymer having C-S bonds is reduced accordingly so that the deposit component in the form of a polymer having C-S bonds is less likely to be attached to the respective sidewalls of the resist pattern 45 and the organic bottom anti-reflective coating 44. In terms of preventing size variations from shifting to the negative value range, therefore, the temperature X of the lower electrode is preferably lower.

As is apparent from FIG. 7, size variations tend to increase when the temperature X of the lower electrode exceeds 15° C. Therefore, the temperature X of the lower electrode is preferably 15° C. or lower.

EMBODIMENT 5

Since each of the first to fourth embodiments has performed dry etching by using etching gas containing gas having the S component such as $SO_2/O_2$ or $COS/O_2$, S-based or $SO_2$-based residues are present on the silicon wafer 41. When etching is performed with respect to the polysilicon film 43 by using the resist pattern 45 as a mask in the subsequent step, the S component present on the polysilicon film 43, the resist pattern 45, and the organic bottom anti-reflective coating 44 may react with moisture contained in the atmosphere to form residues, resulting in a defective pattern configuration of the polysilicon film 43.

To prevent this, a fifth embodiment performs dry etching by using etching gas containing gas having the S component and then plasma processing by using gas containing no S component such as $N_2$ gas to remove the S component remaining on the silicon wafer 41.

In the fifth embodiment also, the first dry-etching apparatus shown in FIG. 2 was used and a film having the structure shown in FIG. 4 was used as a target film.

Conditions for the etching process according to the fifth embodiment are as shown in Table 13. Table 14 shows the results of quantitative analysis of S remaining after etching which was performed by ion chromatography.

TABLE 13

CONDITIONS FOR ETCHING PROCESS

| | (1) STEP OF ARC ETCHING USING $SO_2$ GAS | (2) STEP OF REMOVING S COMPONENT BY USING PLASMA OF $N_2$ GAS |
|---|---|---|
| GAS | $SO_2/O_2$ = 20/20 (sccm) | $N_2$ = 100 (sccm) |
| LEF/RF | 54.24/13.56 (MHz) 3 × 100/70 (W) | 54.24/13.56 (MHz) 3 × 100 × 70 (W) |
| PRESSURE | 5 (mTorr) | 50 (mTorr) |
| TEMPERATURE OF LOWER ELECTRODE | −10 (° C.) | −10 (° C.) |
| SETTING OF ETCHING TIME | 60% OVER | 15 SECONDS |

TABLE 14

| COMBINATION OF STEPS | DETERMINATION OF S BY ION CHROMATOGRAPHY |
|---|---|
| STEP (1) ONLY | 200 µg/8-inch wafer |
| STEP (1) + STEP (2) | 40 µg/8-inch wafer |

As will be understood from Table 14, the result of quantitative analysis of S carried out by ion chromatography was 200 µg/8-inch substrate in the case of performing only the step of dry etching performed with respective to the organic bottom anti-reflective coating 44 by using $SO_2$ gas. By contrast, the result of quantitative analysis of S carried out by ion chromatography was 40 µ g/8-inch substrate in the case of performing dry etching with respect to the organic bottom anti-reflective coating 44 by using $SO_2$ gas and then plasma processing by using $N_2$ gas, which indicates a significant reduction in the amount of S compared with the case involving no plasma processing.

It will therefore be understood that the S component remaining on the silicon wafer 41 can be reduced significantly by performing dry etching with respect to the organic bottom anti-reflective coating 44 by using $SO_2$ gas and then plasma processing by using $N_2$ gas.

Although the fifth embodiment has performed plasma processing by using $N_2$ gas, similar effects can also be achieved by performing plasma processing using gas containing no S component such as $O_2$ gas, Ar gas, or He gas instead.

EMBODIMENT 6

In the case of performing dry etching by using etching gas containing gas having the S component and then plasma processing by using a plasma composed of gas containing no S component such as $N_2$ gas, a sixth embodiment controls a plasma processing time, gas pressure, a gas flow rate, a processing temperature, and a high-frequency output in accordance with the degree of ruggedness of the underlying film such as the polysilicon film 43 and the type of the underlying film. Although an apparatus for performing dry etching does not present a particular problem, the first dry etching apparatus shown in FIG. 2 was used for comparison. A film having the structure shown in FIG. 4 was used as a target film.

Conditions for the etching process according to the sixth embodiment performed with respect to the organic bottom anti-reflective coating 44 by using $SO_2$ gas are as shown in Table 15 and conditions for plasma processing performed by using the plasma composed of $N_2$ gas are as shown in Table 16.

TABLE 15

| CONDITIONS FOR ETCHING PROCESS | |
|---|---|
| $SO_2/O_2$ | 32/8 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | 20 (° C.) |

TABLE 16

| CONDITIONS FOR PLASMA PROCESSING | |
|---|---|
| $N_2$ | 100 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | 20 (° C.) |

Figure 4A:
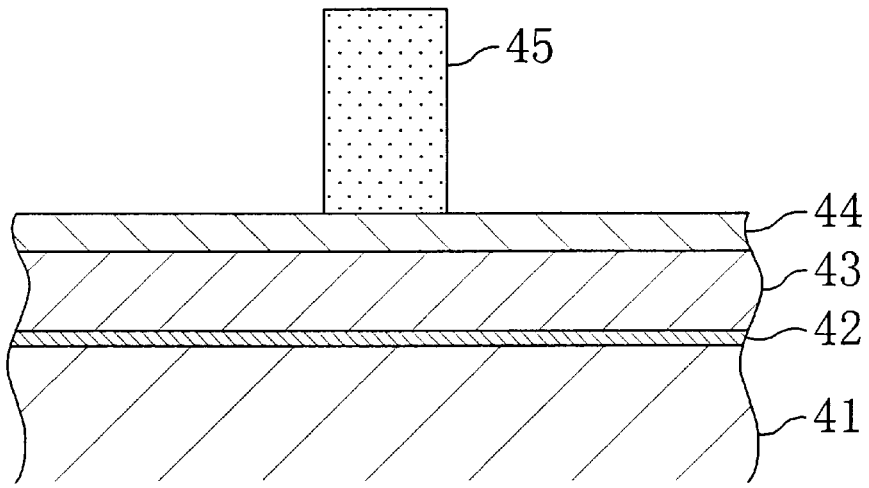
FIGS. 4(a) and 4(b) are cross-sectional views for specifically illustrating individual process steps in the pattern formation method according to each of the embodiments of the present invention and prior art.
Figure 4B:
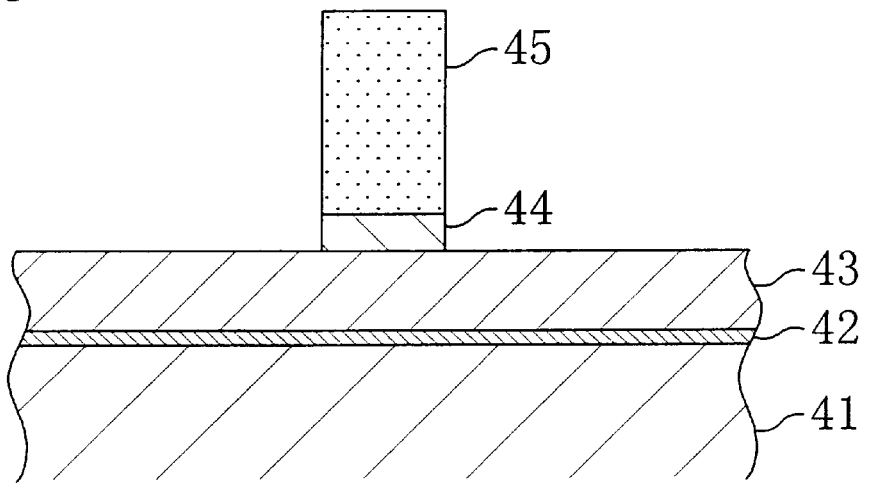

As shown in FIG. 4(b), the organic bottom anti-reflective coating 44 shown in FIG. 4(a) is subjected to dry etching performed by using $SO_2$ gas, which is equivalent to 60% of the entire amount of etching. Then, the polysilicon film 43 is subjected to plasma processing performed by using a plasma composed of $N_2$ gas.

Figure 8:
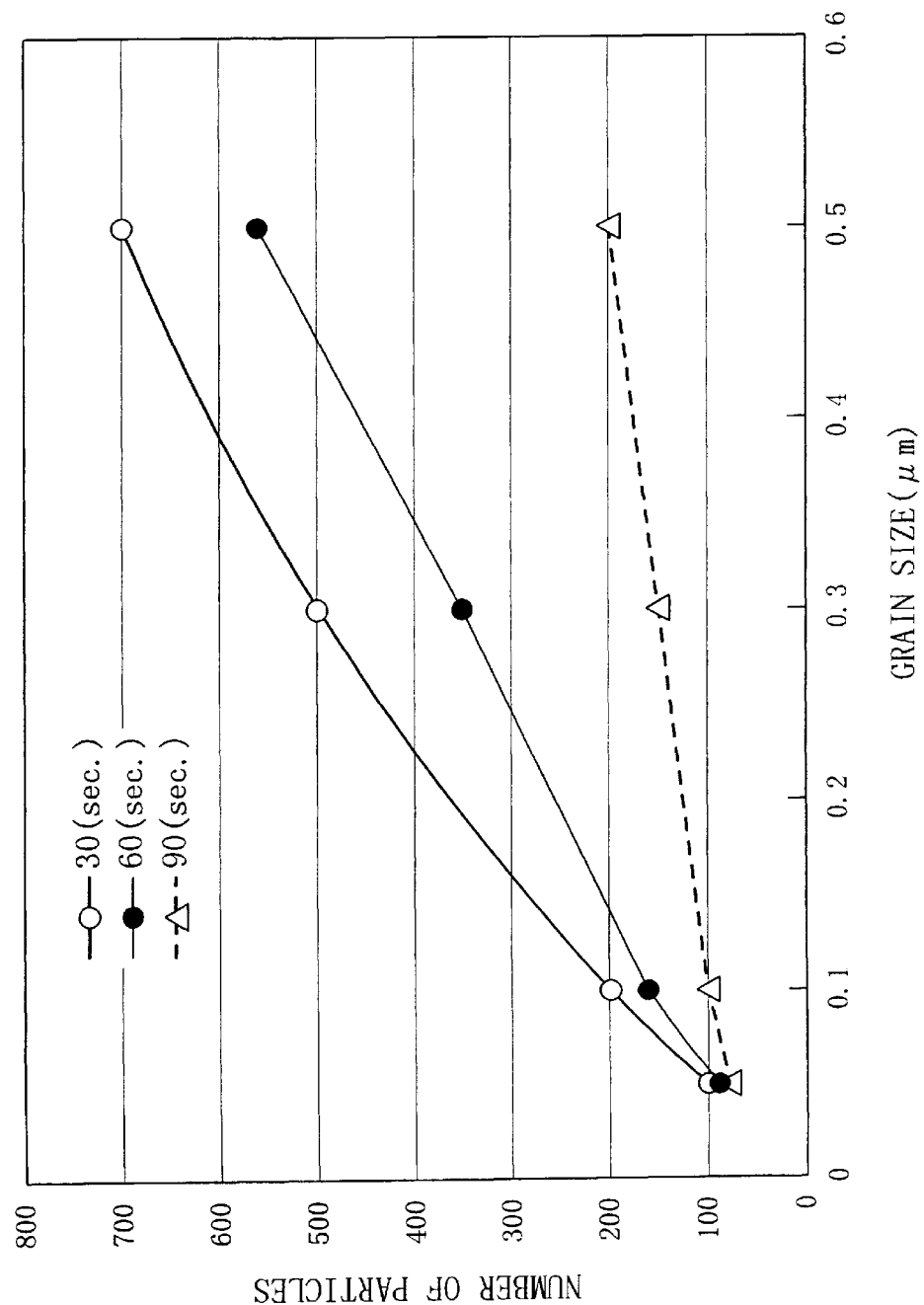
FIG. 8 shows the relation between the grain size of a polysilicon film and the number of particles when a plasma processing time and the grain size are varied in a pattern formation method according to a sixth embodiment of the present invention.

FIG. 8 shows the relation between the grain size of the polysilicon film 43 and the number of particles on the polysilicon film 43 when the time required for plasma processing performed by using the plasma composed of $N_2$ gas and the grain size are varied. The number of particles is counted based on optical reflection obtained when the top surface of the polysilicon film 43 is irradiated with laser light, which is expressed as number/8-inch wafer.

As will be understood from FIG. 8, the number of particles on the polysilicon film 43 is reduced as the grain size of the polysilicon film 43 is reduced from 0.5 μm to 0.05 μm. This may be because grains of larger size and an interface therebetween are more rugged, which may be attributed to an increased quantity of S-based residues. The number of particles on the polysilicon film 43 can also be reduced by increasing the time required for plasma processing performed by using the plasma composed of $N_2$ gas from 30 seconds to 90 seconds. In short, the S-based residues on the polysilicon film 43 and on the resist pattern 45 can be reduced by increasing the time required for plasma processing performed by using the plasma composed of $N_2$ gas based on the grain size of the polysilicon film 43, which in turn reduces the number of particles.

Figure 9:
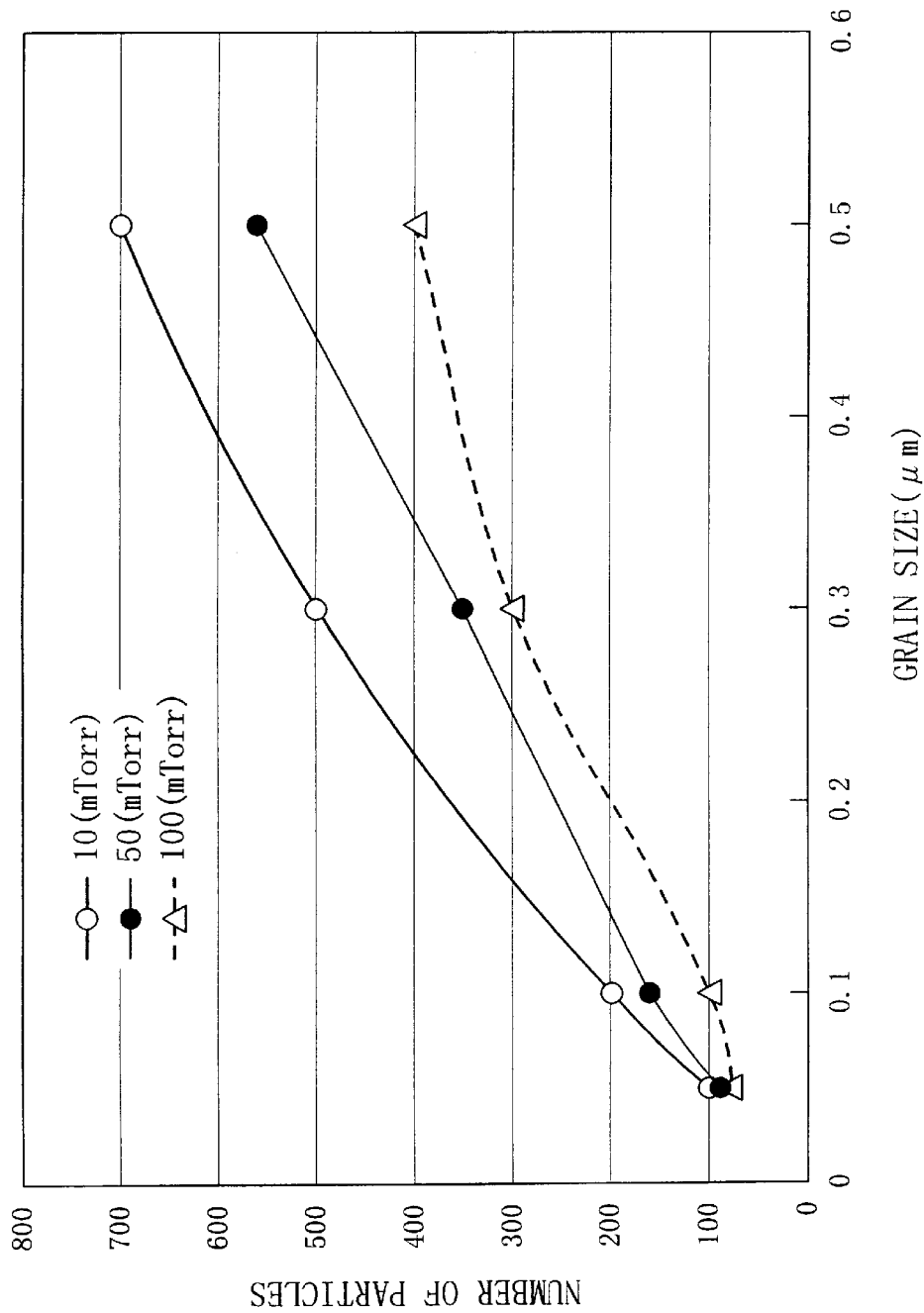
FIG. 9 shows the relation between the grain size of the polysilicon film and the number of particles when gas pressure during plasma processing and the grain size are varied in the pattern formation method according to the sixth embodiment of the present invention.

FIG. 9 shows the relation between the grain size of the polysilicon film 43 and the number of particles on the polysilicon film 43 when the pressure of gas and the grain size are varied. The number of particles is counted based on optical reflection obtained when the top surface of the polysilicon film 43 is irradiated with laser light, which is expressed as number/8 -inch wafer.

As will be understood from FIG. 9, the number of particles on the polysilicon film 43 is reduced as the grain size of the polysilicon film 43is reduced from 0.5 μm to 0.05 μm. The number of particles on the polysilicon film 43 can also be reduced by increasing the pressure of $N_2$ gas during plasma processing from 10 mTorr to 100 mTorr. In short, the S-based residues on the polysilicon film 43 and on the resist pattern 45 can be reduced by increasing the pressure of $N_2$ gas during plasma processing in accordance with the grain size of the polysilicon film 43 and with the ruggedness of the surface of the polysilicon film 43, which in turn reduces the number of particles.

Figure 10:
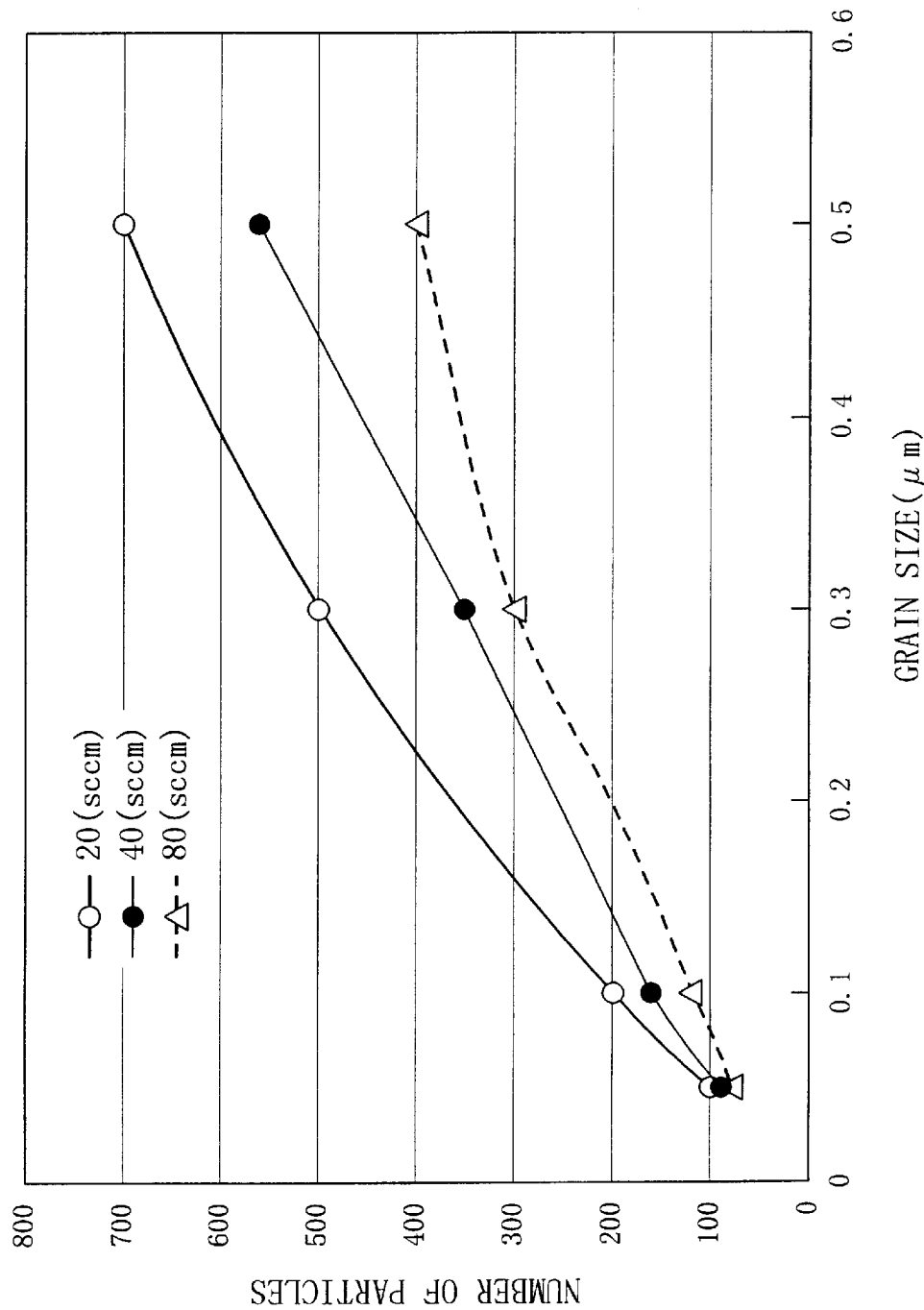
FIG. 10 shows the relation between the grain size of the polysilicon film and the number of particles when a gas flow rate during plasma processing and the grain size are varied in the pattern formation method according to the sixth embodiment of the present invention.

FIG. 10 shows the relation between the grain size of the polysilicon film 43 and the number of particles on the polysilicon film 43 when the flow rate of $N_2$ gas and the grain size are varied. The number of particles is counted based on optical reflection obtained when the top surface of the polysilicon film 43 is irradiated with laser light, which is expressed as number/8-inch wafer.

As will be understood from FIG. 10, the number of particles on the polysilicon film 43 is reduced as the grain size of the polysilicon film 43 is reduced from 0.5 μm to 0.05 μm. The number of particles on the polysilicon film 43 can also be reduced by increasing the flow rate of gas during plasma processing composed of $N_2$ gas from 20 sccm to 80 sccm. In short, the S-based residues on the polysilicon film 43 and on the resist pattern 45 can be reduced by increasing the flow rate of $N_2$ gas during plasma processing in accordance with the grain size of the polysilicon film 43 and with the ruggedness of the surface of the polysilicon film 43, which in turn reduces the number of particles.

Figure 11:
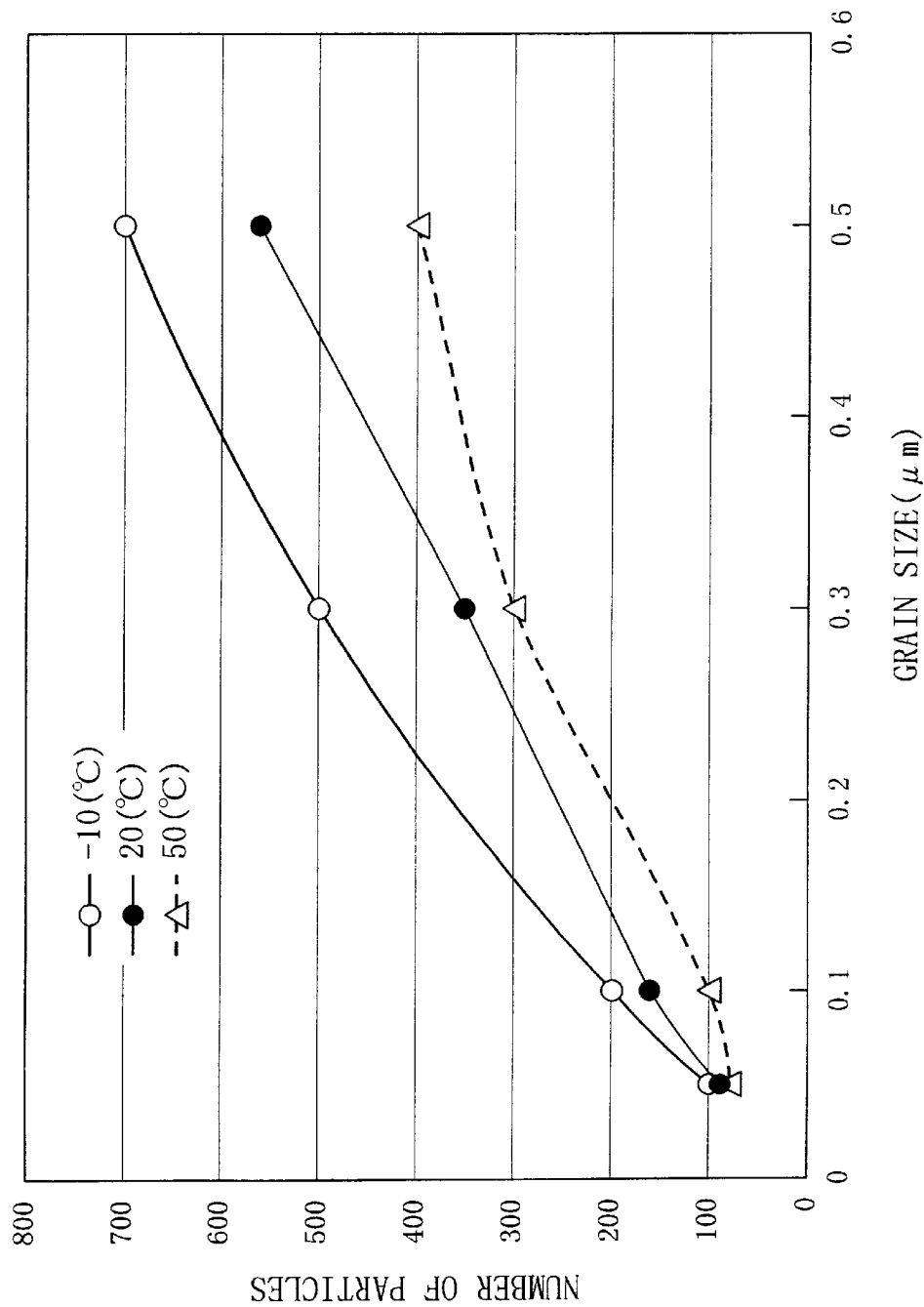
FIG. 11 shows the relation between the grain size of the polysilicon film and the number of particles when a temperature during plasma processing and the grain size are varied in the pattern formation method according to the sixth embodiment of the present invention.

FIG. 11 shows the relation between the grain size of the polysilicon film 43 and the number of particles on the polysilicon film 43 when the temperature of the silicon wafer 41 and the grain size are varied during plasma processing performed by using the plasma composed of $N_2$ gas. The number of particles is counted based on optical reflection obtained when the top surface of the polysilicon film 43 is irradiated with laser light, which is expressed as number/8-inch wafer.

As will be understood from FIG. 11, the number of particles on the polysilicon film 43 is reduced as the grain size of the polysilicon film 43 is reduced from 0.5 μm to 0.05 μm. The number of particles on the polysilicon film 43 can also be reduced by increasing the temperature of the silicon wafer 41 from −10° C. to 50° C. during plasma processing performed by using the plasma composed of $N_2$ gas. In short, the S-based residues on the polysilicon film 43 and on the resist pattern 45 can be reduced by increasing the temperature of the silicon wafer 41 during plasma processing performed by using the plasma composed of $N_2$ gas in accordance with the grain size of the polysilicon film 43 and with the ruggedness of the surface of the polysilicon film 43, which in turn reduces the number of particles.

Figure 12:
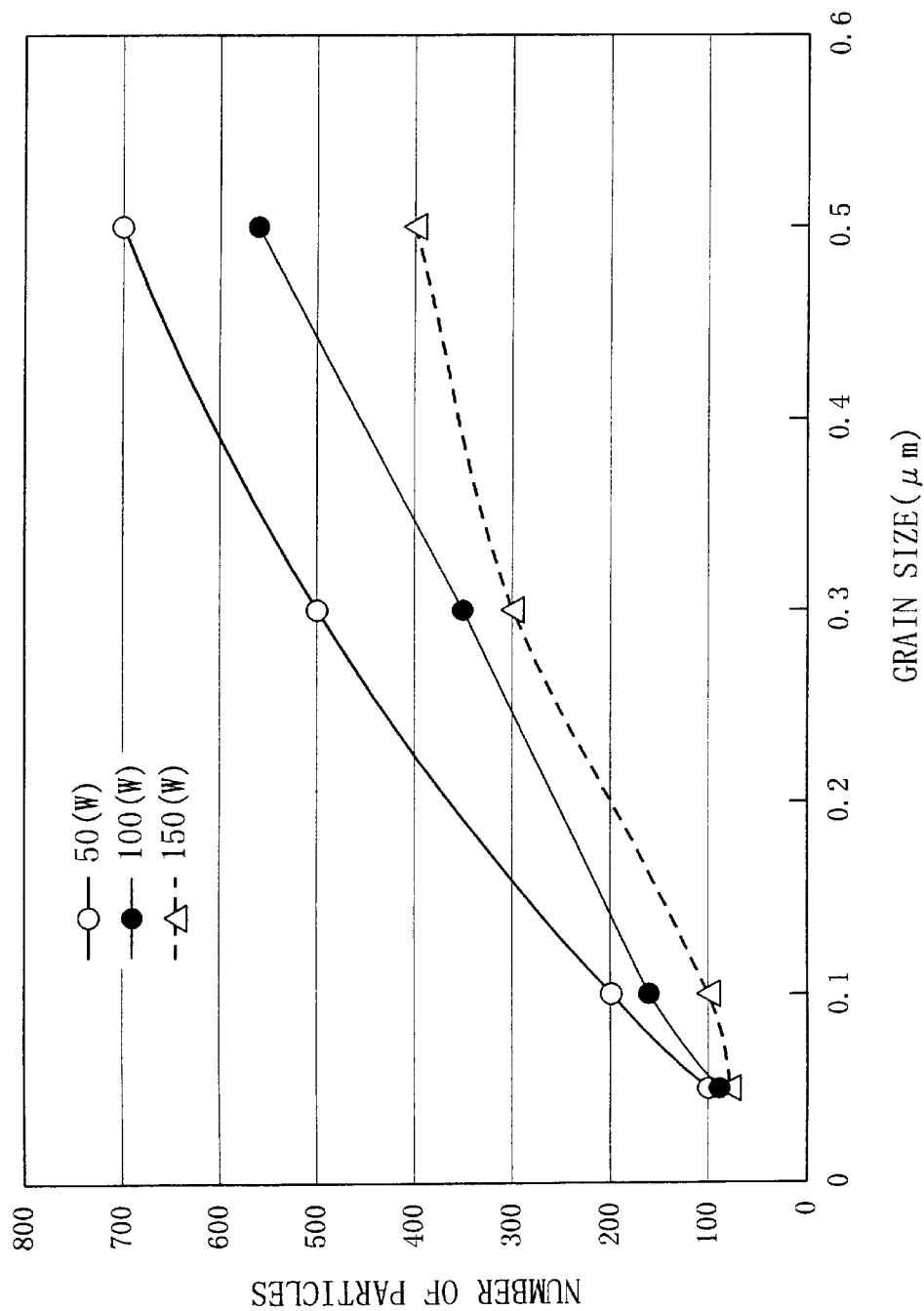
FIG. 12 shows the relation between the grain size of the polysilicon film and the number of particles when LEP power during plasma processing and the grain size are varied in the pattern formation method according to the sixth embodiment of the present invention.

FIG. 12 shows the relation between the grain size of the polysilicon film 43 and the number of particles on the polysilicon film 43 when LEP power and the grain size are varied during plasma processing performed by using the plasma composed of $N_2$ gas. The number of particles is counted based on optical reflection obtained when the top surface of the polysilicon film 43 is irradiated with laser light, which is expressed as number/8-inch wafer.

As will be understood from FIG. 12, the number of particles on the polysilicon film 43 is reduced as the grain size of the polysilicon film 43 is reduced from 0.5 μm to 0.05 μm. The number of particles on the polysilicon film 43 can also be reduced by increasing LEP power from 50 W to 150 W during plasma processing performed by using the plasma composed of $N_2$ gas. In short, the S-based residues on the polysilicon film 43 and on the resist pattern 45 can be reduced by increasing LEP power during plasma processing performed by using the plasma composed of $N_2$ gas in accordance with the grain size of the polysilicon film 43 and with the ruggedness of the surface of the polysilicon film 43, which in turn reduces the number of particles.

Figure 13:
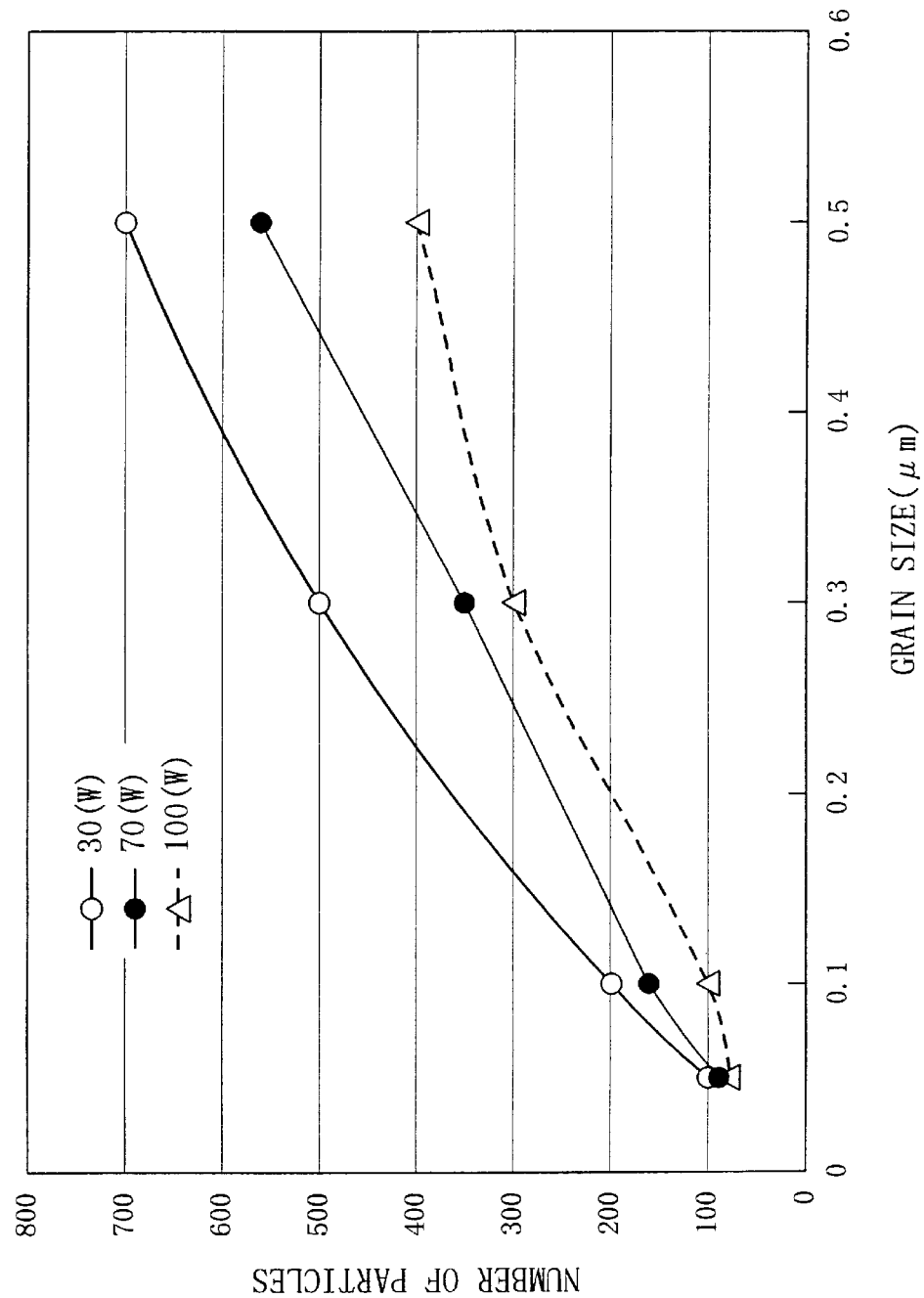
FIG. 13 shows the relation between the grain size of the polysilicon film and the number of particles when RE power during plasma processing and the grain size are varied in the pattern formation method according to the sixth embodiment of the present invention.

FIG. 13 shows the relation between the grain size of the polysilicon film 43 and the number of particles on the polysilicon film 43 when RF power and the grain size are varied during plasma processing performed by using the plasma composed of $N_2$ gas. The number of particles is counted based on optical reflection obtained when the top surface of the polysilicon film 43 is irradiated with laser light, which is expressed as number/8-inch wafer.

As will be understood from FIG. 13, the number of particles on the polysilicon film 43 is reduced as the grain size of the polysilicon film 43 is reduced from 0.5 μm to 0.05 μm. The number of particles on the polysilicon film 43 can also be reduced by increasing RF power from 50 W to 150 W during plasma processing performed by using the plasma composed of $N_2$ gas. In short, the S-based residues on the polysilicon film 43 and on the resist pattern 45 can be reduced by increasing RF power during plasma processing performed by using the plasma composed of $N_2$ gas in accordance with the grain size of the polysilicon film 43 and with the ruggedness of the surface of the polysilicon film 43, which in turn reduces the number of particles.

Figure 14:
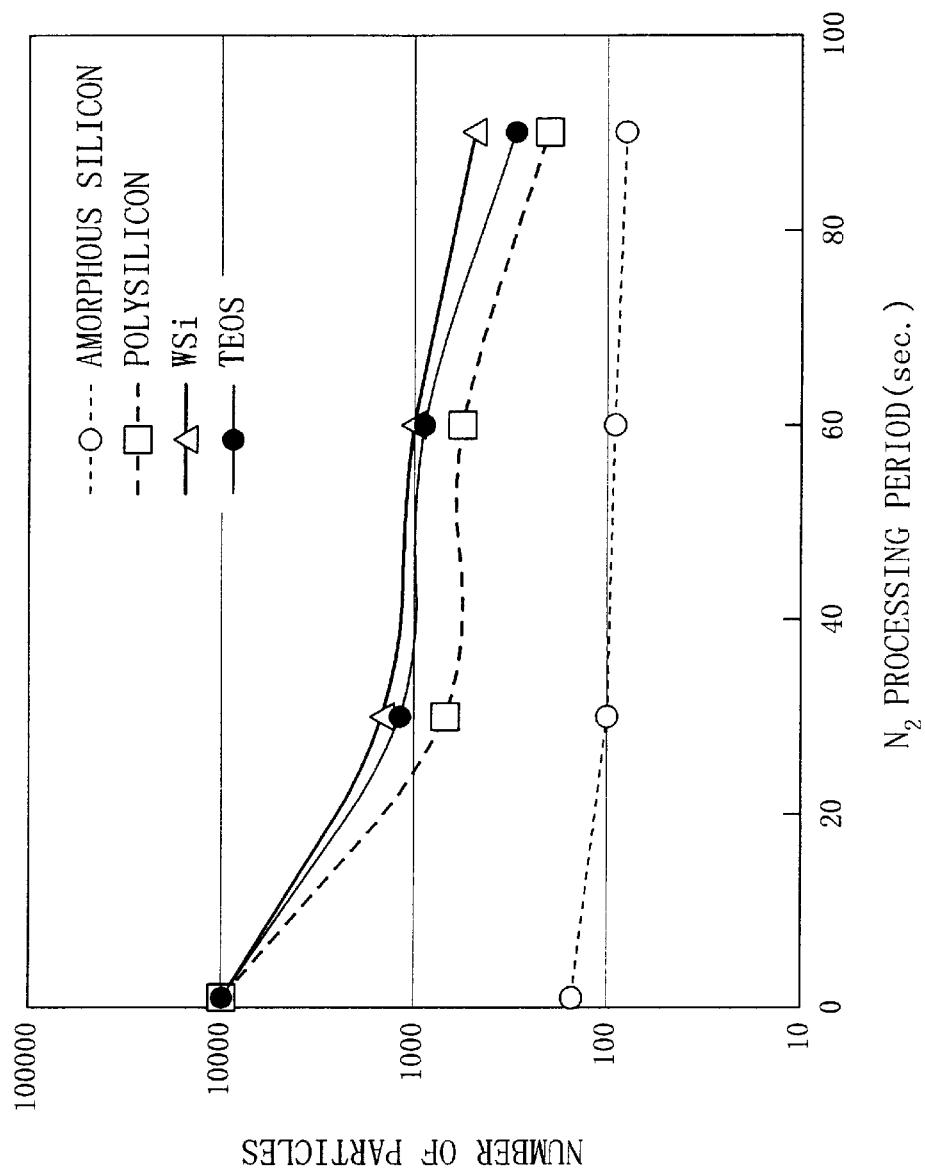
FIG. 14 shows the relation between a plasma processing time and the number of particles when the plasma processing time is varied and different types of underlying films are used in the pattern formation method according to the sixth embodiment of the present invention.

FIG. 14 shows the relation between a plasma processing time and the number of particles on the polysilicon film 43 when plasma processing is performed by using the plasma composed of $N_2$ gas and different types of underlying films, while varying the processing time. The number of particles is counted based on optical reflection obtained when the top surface of the polysilicon film 43 is irradiated with laser light, which is expressed as number/8-inch wafer.

As will be understood from FIG. 14, the number of particles after plasma processing performed by using the plasma composed of $N_2$ gas is varied with different types of underlying films which are an amorphous silicon film, a polysilicon film, a WSi film, and a TEOS film. The number of particles on the underlying film can also be reduced by increasing the plasma processing time from 0 to 90 seconds. In short, the number of particles can be reduced by varying the plasma processing time depending on the type of the underlying film in use.

Although the plasma processing time has been used as an example in describing the effect of varying conditions for plasma processing performed by using the plasma composed of $N_2$ gas depending on the type of the underlying film in use, it will be appreciated that similar effects can be achieved by varying gas pressure, a gas flow rate, LEP power, RF power, the temperature of the silicon wafer 41, or the like during plasma processing.

EMBODIMENT 7

A seventh embodiment performs dry etching with respect to the organic bottom anti-reflective coating by using $SO_2$-based etching gas and heats the silicon wafer 41 to evaporate and remove the S component present on the polysilicon film 43, the resist pattern 45, and the organic bottom anti-reflective coating 44.

Although an apparatus for performing dry etching does not present a particular problem, the first dry etching apparatus shown in FIG. 2 was used for comparison. A film having the structure shown in FIG. 4 was used as a target film.

Conditions for the etching process according to the seventh embodiment performed with respect to the organic bottom anti-reflective coating 44 by using $SO_2$ gas are as shown in Table 17.

TABLE 17

| CONDITIONS FOR ETCHING PROCESS | |
| --- | --- |
| $SO_2/O_2$ | 32/8 (sccm) |
| LEP/RF | 54.24/13.56 (MHz) |
|  | 3 × 100/70 (W) |
| PRESSURE | 5 (mTorr) |
| TEMPERATURE OF LOWER ELECTRODE | 20 (° C.) |

After dry etching is performed with respect to the organic bottom anti-reflective coating 44 by using $SO_2$ gas, the silicon wafer 41 is placed and heated in a hot plate oven for 1 minute.

Figure 15:
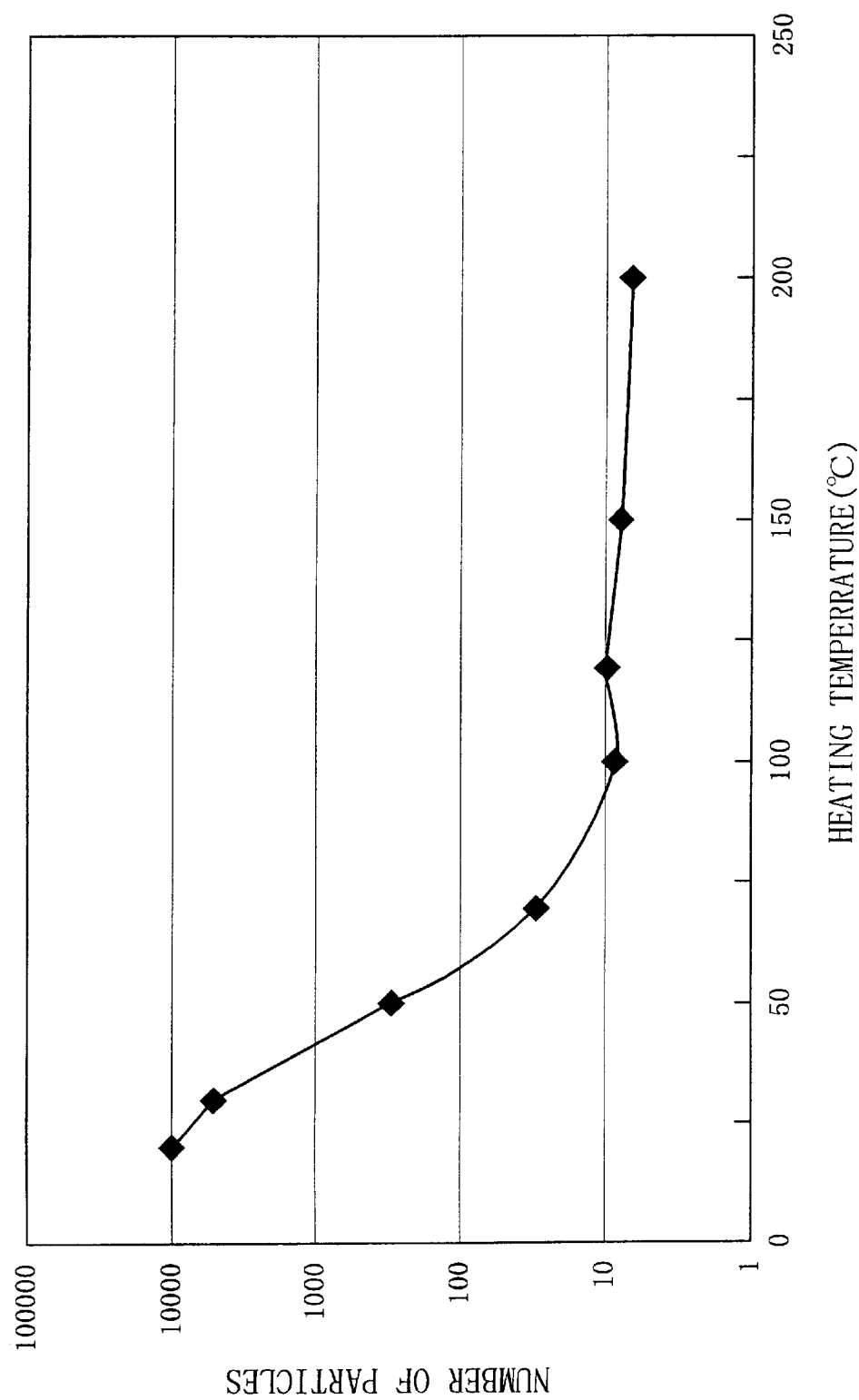
FIG. 15 shows the relation between a heating temperature in a hot plate oven and the number of particles when the heating temperature is varied in a pattern formation method according to a seventh embodiment of the present invention.

FIG. 15 shows the relation between a heating temperature in the hot plate oven and the number of particles on the polysilicon film 43 when the heating temperature is varied. The number of particles is counted based on optical reflection obtained when the top surface of the polysilicon film 43 is irradiated with laser light, which is expressed as number/8-inch wafer.

As will be understood from FIG. 15, the number of particles on the polysilicon film 43 is reduced as the heating temperature is increased from 30° C. In particular, the number of particles is reduced significantly when the heating temperature becomes 70° C. or higher. On the other hand, the resist pattern 45 is deformed when the heating temperature becomes 120° C. or higher, so that the heating temperature is preferably in the range of 70° to 120° C. Since the number of particles is 10 or less and barely varies when the heating temperature becomes 120° C. or higher, a particularly preferred heating temperature is on the order of 100° C.

Figure 16:
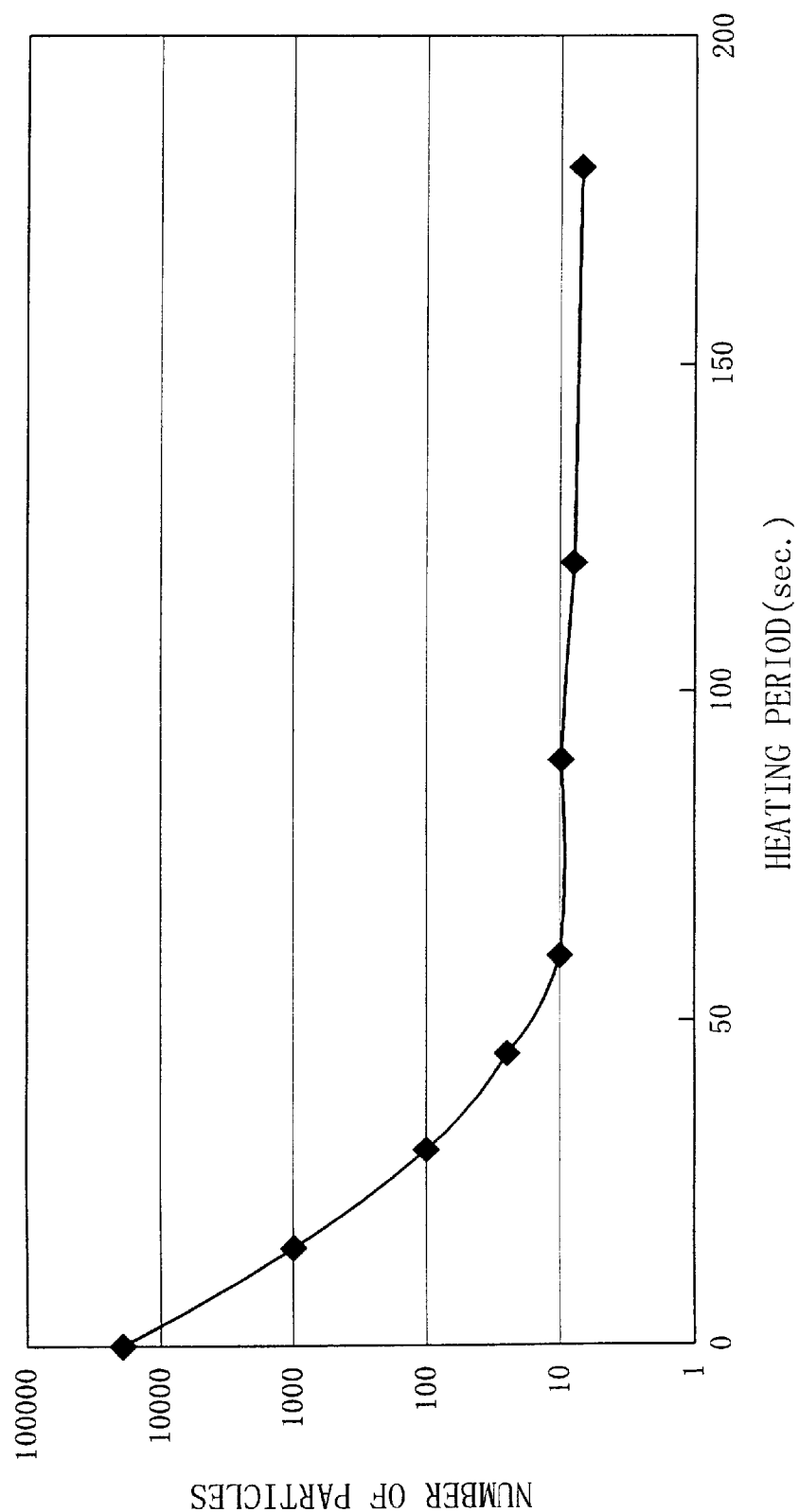
FIG. 16 shows the relation between a heating time in the hot plate oven and the number of particles when the heating time is varied in the pattern formation method according to the seventh embodiment of the present invention.

FIG. 16 shows the relationship between a heating time and the number of particles on the polysilicon film 43 when the silicon wafer 41 is heated in a hot plate oven at 100° C. The number of particles is counted based on optical reflection obtained when the top surface of the polysilicon film 43 is irradiated with laser light, which is expressed as number/8-inch wafer.

As will be understood from FIG. 16, the number of particles is reduced as the heating time is increased from 0 to 60 seconds. However, the number of particles is 10 or less and barely varies when the heating time becomes 60 seconds or longer.

Figure 17:
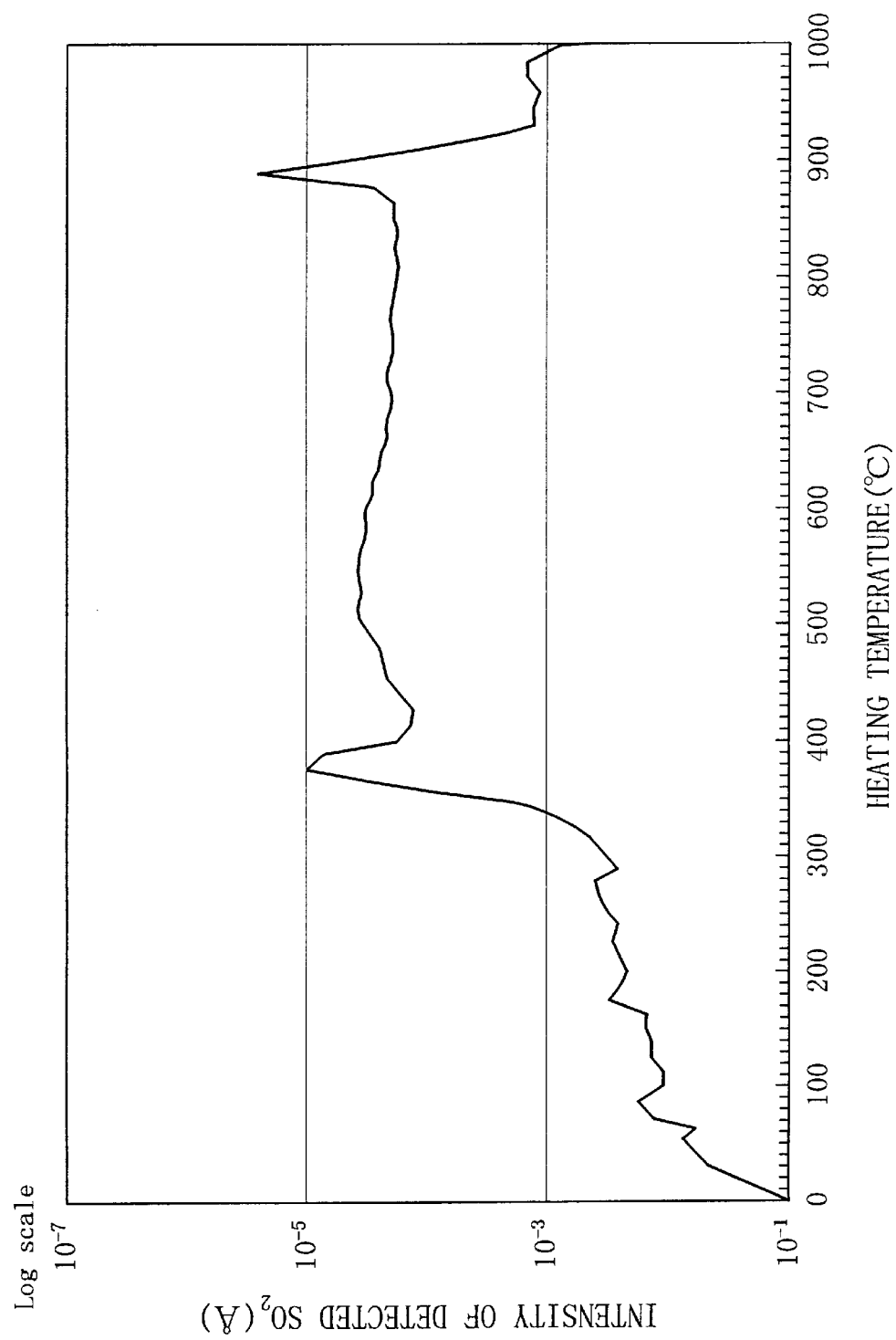
FIG. 17 shows the relation between a heating temperature in the hot plate oven and the intensity of a $SO_2$ component detected by TDS when the heating temperature is varied in a pattern formation method according to the seventh embodiment of the present invention.

FIG. 17 shows the relation between a heating temperature and the intensity of a $SO_2$ component detected by TDS (Thermal Desorption mass Spectroscopy), i.e., the relation between the heating temperature and the desorption of the S component.

As will be understood from FIG. 17, the amount of discharged $SO_2$ is increased as the heating temperature is increased at the heating temperature ranging from 0° to 300° C., though there are slight variations.

The results show that the S-based residues on the polysilicon film 43 and on the resist pattern 45 are evaporated and removed by heating the silicon wafer 41 in the hot plate oven after performing dry etching with respect to the organic bottom anti-reflective coating 44 by using $SO_2$ gas, resulting in a reduced number of particles.

EMBODIMENT 8

An eight embodiment performs dry etching with respect to the organic bottom anti-reflective coating by using $SO_2$-based etching gas and then washes the silicon 41 with warm water, thereby removing residues having the S component present on the polysilicon film 43, the resist pattern 45, and the organic bottom anti-reflective coating 44.

Although an apparatus for performing dry etching does not present a particular problem, the first dry etching apparatus shown in FIG. 2 was used for comparison. A film having the structure shown in FIG. 4 was used as a target film.

Conditions for the etching process according to the eighth embodiment performed with respect to the organic bottom anti-reflective coating 44 by using $SO_2$ gas are as shown in Table 18.

TABLE 18

| CONDITIONS FOR ETCHING PROCESS | |
| --- | --- |
| $SO_2/O_2$ | 32/8 (sccm) |
| LEP/RF | 54.24/13.56 (MHz) |
|  | 3 × 100/70 (W) |
| PRESSURE | 5 (mTorr) |
| TEMPERATURE OF LOWER ELECTRODE | 20 (° C.) |

After dry etching is performed with respect to the organic bottom anti-reflective coating 44 by using $SO_2$ gas, the silicon wafer 41 is washed in a washing bath for 90 seconds.

Figure 18:
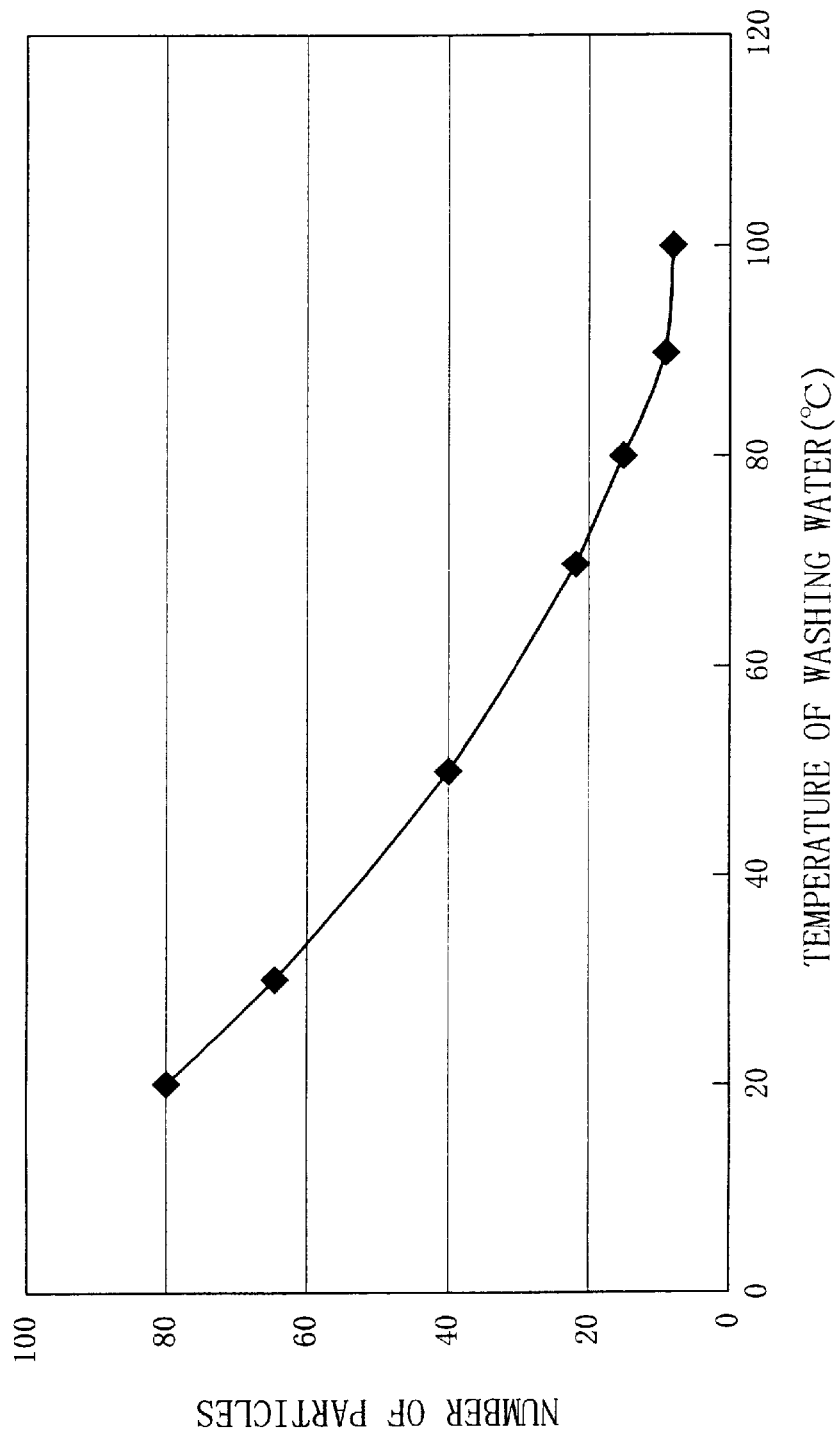
FIG. 18 shows the relation between the temperature of washing water and the number of particles when the temperature of washing water is varied in a pattern formation method according to an eighth embodiment of the present invention.

FIG. 18 shows the relation between the temperature of washing water and the number of particles on the polysilicon film 43 when the temperature of washing water is varied. The number of particles is counted based on optical reflection obtained when the top surface of the polysilicon film 43 is irradiated with laser light, which is expressed as number/8-inch wafer.

As will be understood from FIG. 18, the number of particles on the polysilicon film 43 is reduced as the temperature of washing water is increased from 20° C. to 100° C. However, since water boils at 100° C., washing should be performed at a temperature of 90° C. or lower.

Figure 19:
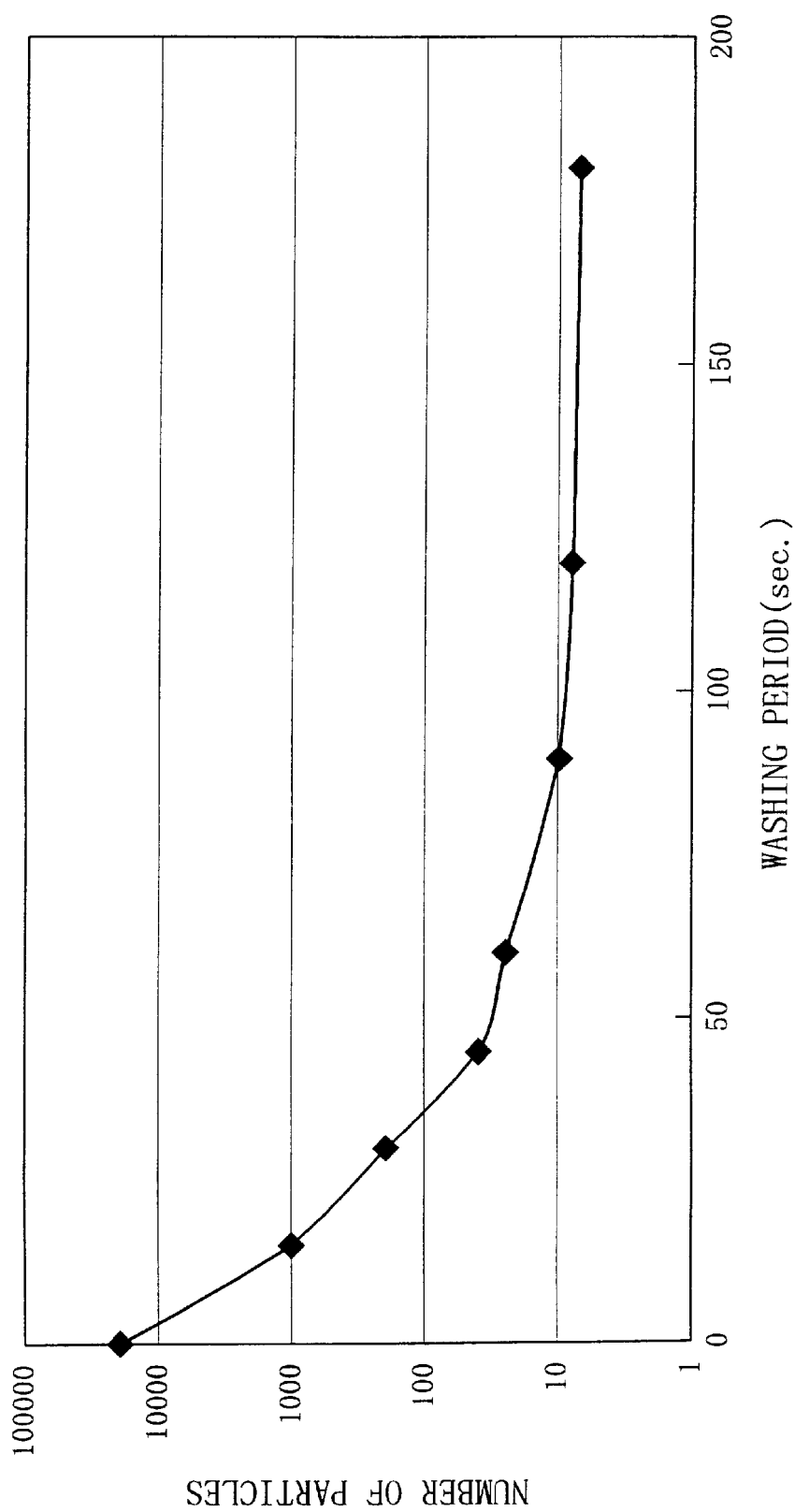
FIG. 19 shows the relation between a washing time and the number of particles when the washing time is varied in the pattern formation method according to the eighth embodiment of the present invention.

FIG. 19 shows the relation between a washing time and the number of particles on the polysilicon film 43 when the silicon wafer 41 is washed in the washing bath at 70° C. The number of particles is counted based on optical reflection obtained when the top surface of the polysilicon film 43 is irradiated with laser light, which is expressed as number/8-inch wafer.

As will be understood from FIG. 19, the number of particles is reduced as the washing time is increased from 0 to 120 seconds. However, the number of particles is 10 or less and barely varies when the washing time becomes 120 seconds or longer.

The results show that the S-based residues on the polysilicon film 43 and on the resist pattern 45 are evaporated and removed by washing the silicon wafer 41 with warm water after performing dry etching with respect to the organic bottom anti-reflective coating 44 by using $SO_2$ gas, resulting in a reduced number of particles.

EMBODIMENT 9

A ninth embodiment performs dry etching with respect to the organic bottom anti-reflective coating by using $SO_2$ etching gas, neutralizes acidic residues containing sulfuric acid as the main component and remaining on the silicon wafer 41 with an alkaline developing solution for lithography, and washes away the developing solution to thereby remove the residues having the S component present on the polysilicon film 43, the resist pattern 45, and the organic bottom anti-reflective coating 44.

Although an apparatus for performing dry etching does not present a particular problem, the first dry etching apparatus shown in FIG. 2 was used for comparison. A film having the structure shown in FIG. 4 was used as a target film.

Conditions for the etching process according to the ninth embodiment performed with respect to the organic bottom anti-reflective coating 44 by using $SO_2$ are as shown in Table 19.

TABLE 19

| CONDITIONS FOR ETCHING PROCESS | |
|---|---|
| $SO_2/O_2$ | 32/8 (sccm) |
| LEP/RF | 54.24/13.56 (MHz) |
| | 3 × 100/70 (W) |
| PRESSURE | 5 (mTorr) |
| TEMPERATURE OF LOWER ELECTRODE | 20 (° C.) |

When dry etching is performed with respect to the organic bottom anti-reflective coating 44 by using $SO_2$ gas, residues containing sulfuric acid as the main component are left on the silicon wafer 41. The residues containing sulfuric acid are neutralized with the alkaline developing solution and thereby removed. Thereafter, the silicon wafer 41 and the organic bottom anti-reflective coating 44 are washed with water so that the remaining developing solution is removed. A developing solution normally used for lithography in a semiconductor manufacturing process is used in the present embodiment. The developing solution contains TMH (Tri-Methyl Ammonium Hydroxide) as the main component. Since the developing solution contains no alkaline metal, no metal contamination occurs.

Figure 20:
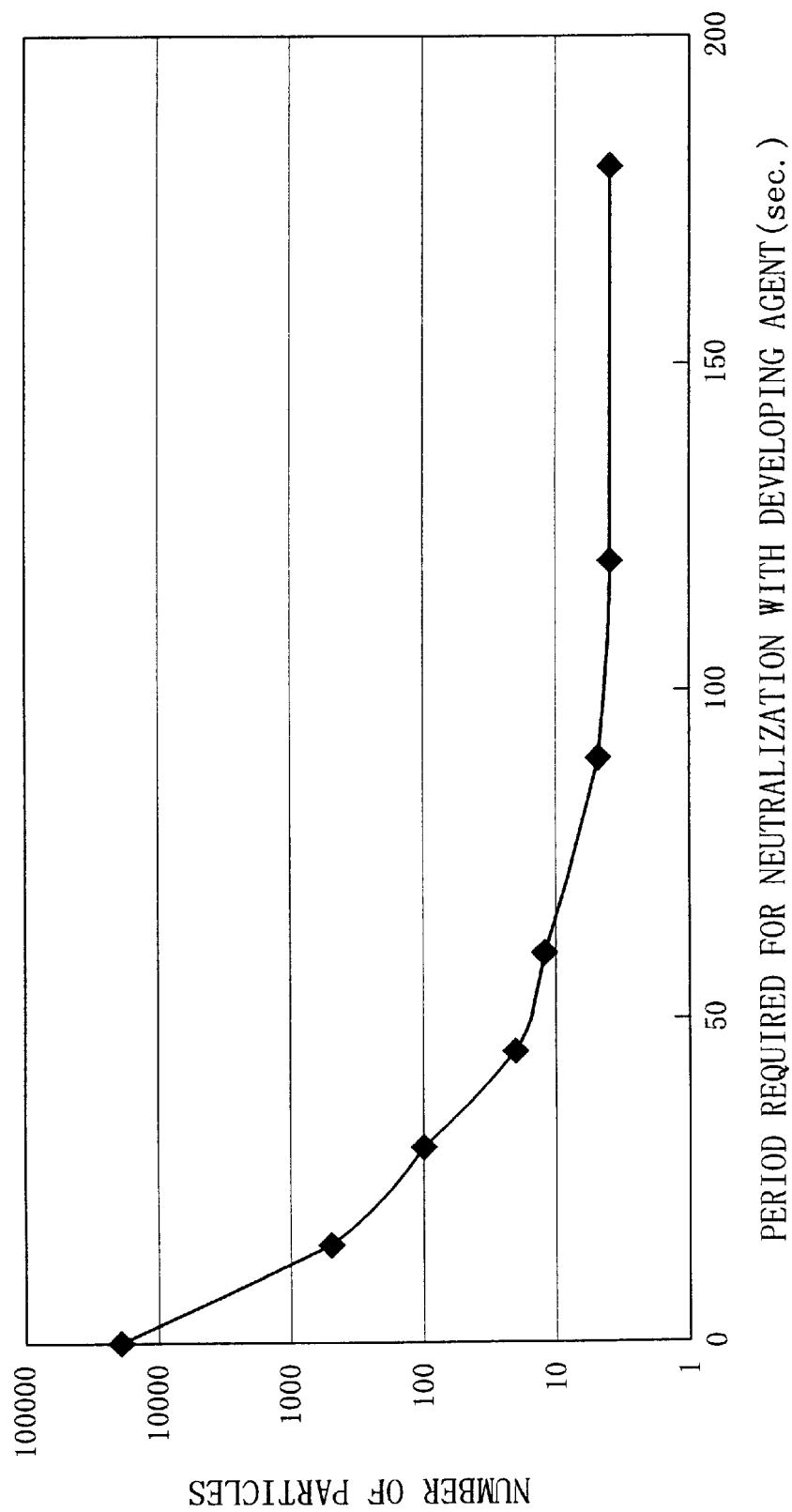
FIG. 20 shows the relation between a neutralization time and the number of particles when the neutralization time is varied in a pattern formation method according to a ninth embodiment of the present invention.
Figure 21:
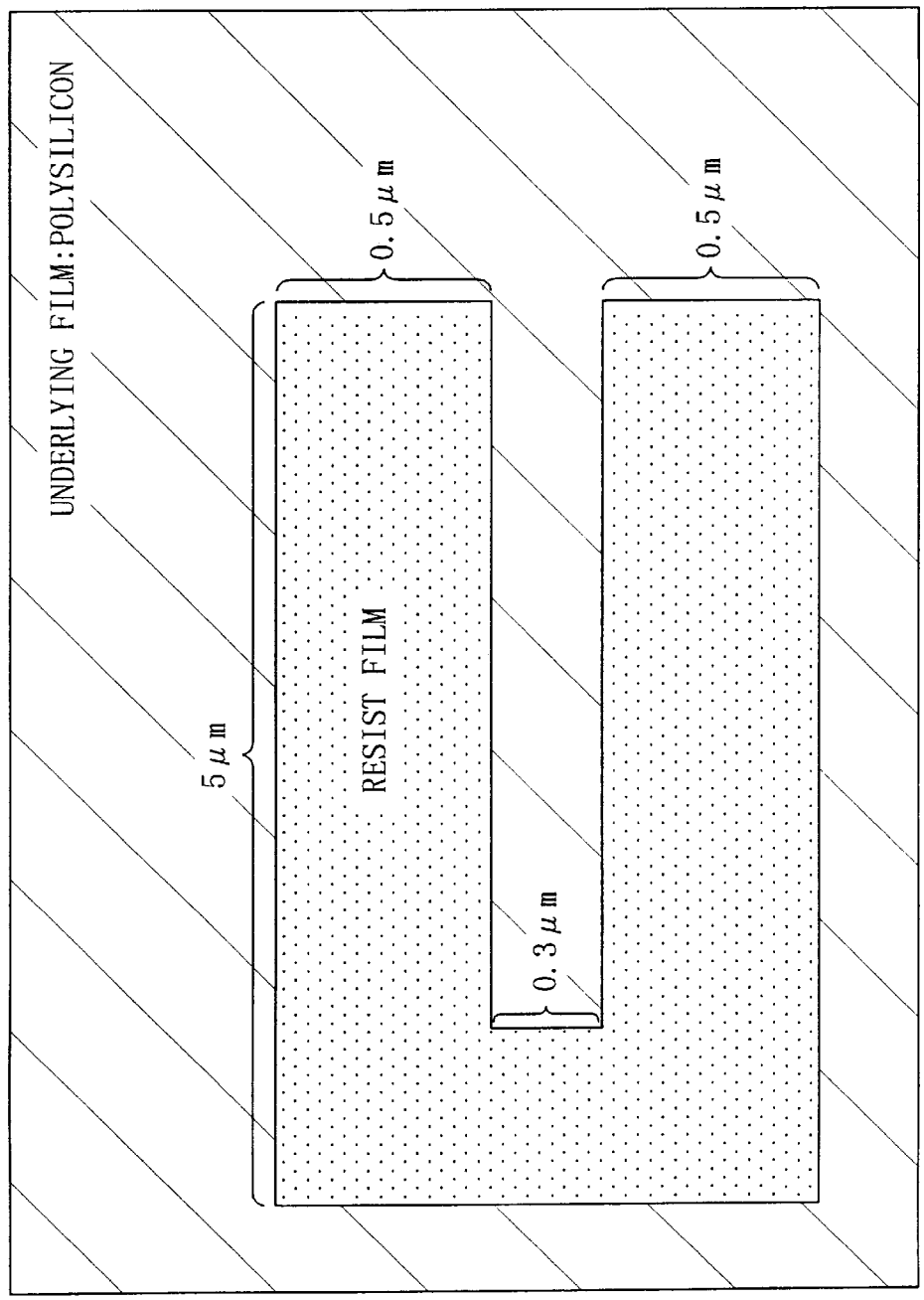
FIG. 21 is a plan view of a resist pattern causing surface roughness at an underlying film in a conventional pattern formation method.
Figure 22:
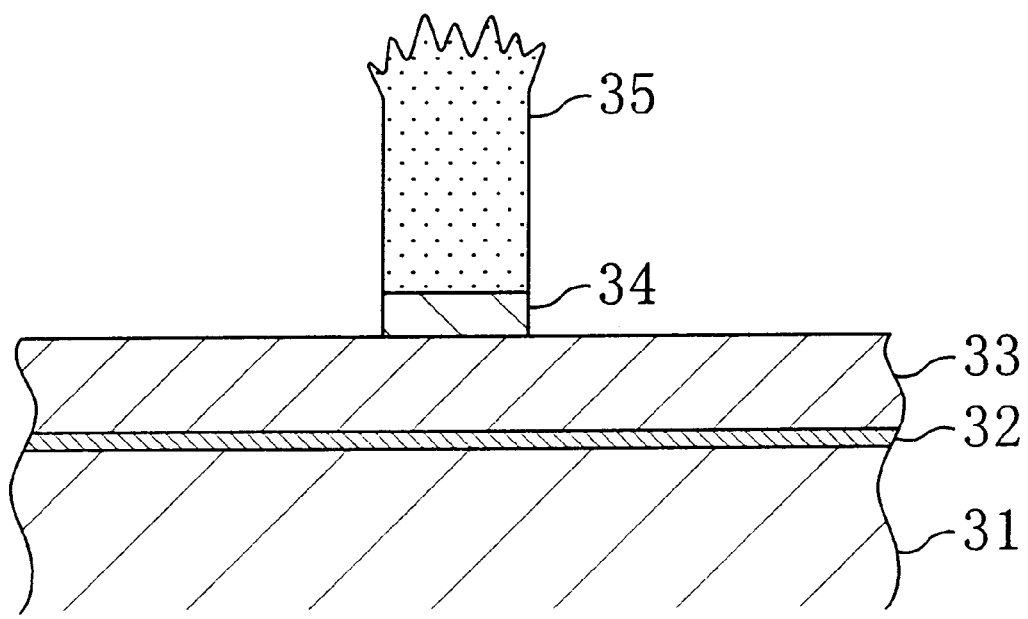
FIG. 22 is a cross-sectional view showing the condition of an upper portion of a resist pattern after dry etching in a pattern formation method according to a twelfth embodiment of the present invention.

FIG. 20 shows the relation between a neutralization time and the number of particles on the polysilicon film 43 when the residues containing sulfuric acid as the main component are neutralized with the developing solution at 22° C. The number of particles is counted based on optical reflection obtained when the top surface of the polysilicon film 43 is irradiated with laser light, which is expressed as number/8-inch wafer. As will be understood from FIG. 20, the number of particles on the polysilicon film 43 is reduced as the developing time is increased from 0 to 120 seconds. However, the number of particles is 10 or less and barely varies when the developing time becomes 120 seconds or longer.

The results show that the S-based residues on the polysilicon film 43 and on the resist pattern 45 are evaporated and removed by neutralizing the acidic residues on the silicon wafer 41 with the alkaline developing solution and washing away the developing solution with water after dry etching is performed with respect to the organic bottom anti-reflective coating 44 by using $SO_2$ gas, resulting in a reduced number of particles.

Although each of the fifth to ninth embodiments has used the polysilicon film 43 as the underlying film for the organic bottom anti-reflective coating 44, it will be appreciated that similar effects can also be achieved in the case where the underlying film is composed of an oxide film such as TEOS, a nitride film, a tungsten silicide film, a metal alloy film, a ferroelectric film, or the like in the step of removing the remaining S component resulting from dry etching previously performed by using etching gas containing gas having the S component.

Although each of the first to ninth embodiments has used the first dry-etching apparatus in accordance with the LEP (Lissajous Electron Plasma) system shown in FIG. 2, it will be appreciated that similar effects can also be achieved even when a dry-etching apparatus having a plasma source in accordance with RIE (Reactive Ion Etching), ECR (Electron Cyclotron Resonance), ICP (Inductive Coupled Plasma), TCP (Transformer Coupled Plasma), or like system is used.

EMBODIMENT 10

A tenth embodiment has been achieved based on the foregoing second knowledge. Specifically, the tenth embodiment performs dry etching with respect to the organic bottom anti-reflective coating 44 containing silicon by using $Cl_2/O_2$-based etching gas containing halogen as the main component. As a result of analysis, it was found that the material of the organic bottom anti-reflective coating (CD9™ commercially available from Brewer Science Co., U.S.A.) used in the tenth embodiment had about 10 ppm of silicon mixed therein.

Figure 3:
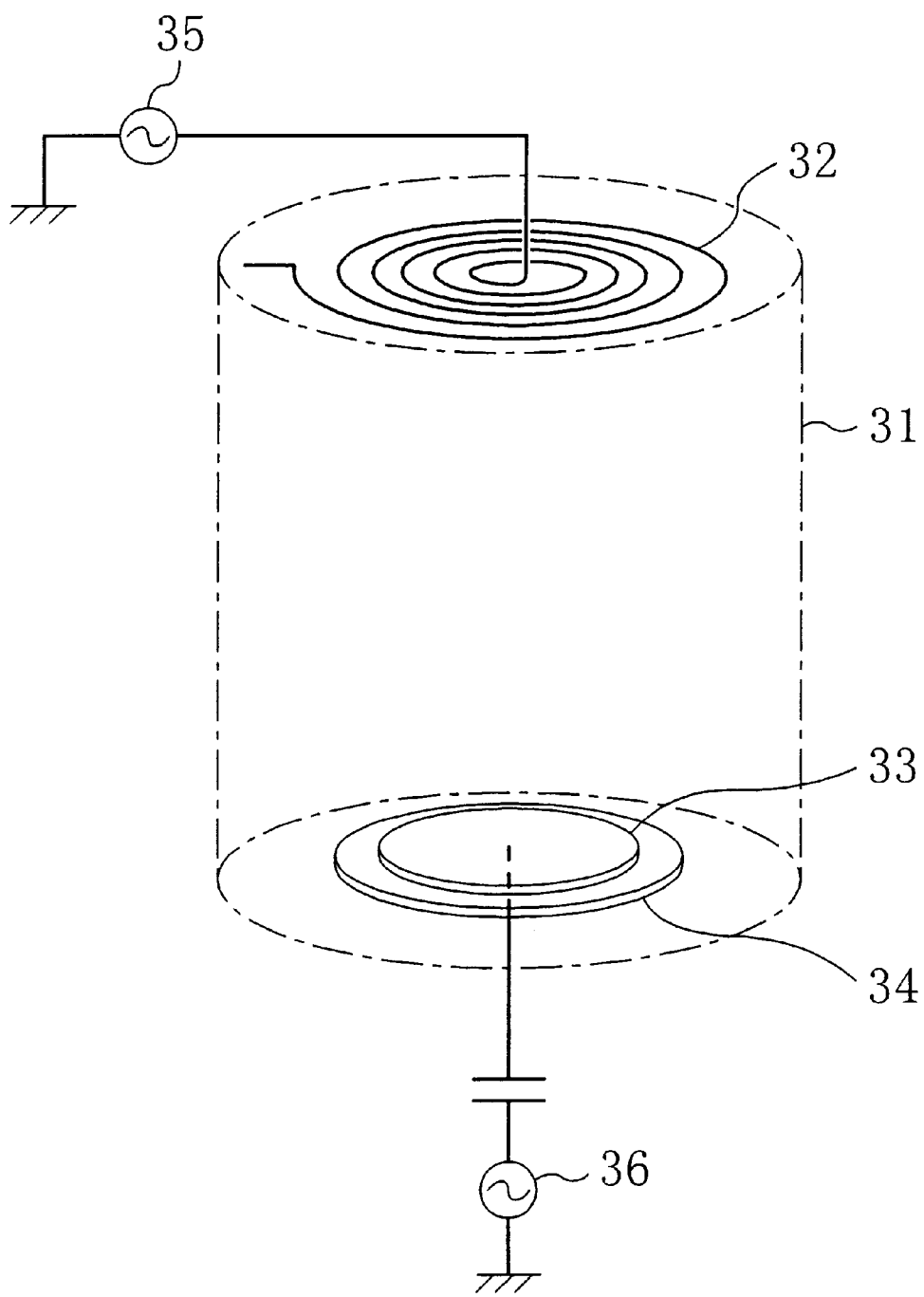
FIG. 3 is a schematic view of a second etching apparatus used by the pattern formation method according to each of the embodiments of the present invention and prior art.

Although an apparatus for performing dry etching does not present a particular problem, the second dry etching apparatus shown in FIG. 3 was used for comparison. A film having the structure shown in FIG. 4 was used as a target film.

Conditions for the etching process according to the tenth embodiment are as shown in Table 20.

TABLE 20

| CONDITIONS FOR ETCHING PROCESS | |
|---|---|
| $Cl_2/O_2$ | 20/20 (sccm) |
| ICP/RF | 13.56 (MHz) |
| | 300/70 (W) |
| PRESSURE | 5 (mTorr) |
| TEMPERATURE GF LOWER ELECTRODE | 10 (° C.) |

Etching properties are as shown in Table 21. As will be understood from Table 21, the organic bottom anti-reflective coating exhibited vertical profiles, though there are slight variations in the size of the organic bottom anti-reflective coating 44. Moreover, foreign residues generated by conventional dry etching using $N_2/O_2$ gas was no more generated.

TABLE 21

| ETCHING PROPERTIES | |
| --- | --- |
| ARC ETCH RATE | 200 (Å/min) |
| UNIFORMITY | ±3.5 (%) |
| SIZE VARIATION | −0.05 μm (open) |
| | −0.02 μm (dense) |
| SELECTIVITY TO POLYSILICON FILM | ∞ |
| FOREIGN RESIDUE | NONE |

The reason for no foreign residue may be that silicon contained in the organic bottom anti-reflective coating 44 is etched by Cl radicals contained in $Cl_2/O_2$-based etching gas and there is no unreacted silicon component left.

EMBODIMENT 11

An eleventh embodiment has also been achieved based on the foregoing second knowledge. Specifically, the eleventh embodiment performs dry etching with respect to the organic bottom anti-reflective coating 44 by using etching gas composed of $Cl_2/O_2$-based etching gas with $SO_2$ gas added thereto. The eleventh embodiment has also used the material of the organic bottom anti-reflective coating (CD9™ commercially available from Brewer Science Co., U.S.A.). The eleventh embodiment has also used the second dry etching apparatus shown in FIG. 3 and the film having the structure shown in FIG. 4 as a target film, similarly to the tenth embodiment.

Conditions for the etching process according to the eleventh embodiment are as shown in Table 22. Etching properties are as shown In Table 23. As will be understood from Table 23, vertical profiles were obtained with reduced size variations. There was no foreign residue similarly to the tenth embodiment.

TABLE 22

| CONDITIONS FOR ETCHING PROCESS | |
| --- | --- |
| $Cl_2/SO_2/O_2$ | 10/10/20 (sccm) |
| ICP/RF | 13.56 (MHz) |
| | 300/70 (W) |
| PRESSURE | 5 (mTorr) |
| TEMPERATURE OF LOWER ELECTRODE | 10 (° C.) |

TABLE 23

| ETCHING PROPERTIES | |
| --- | --- |
| ARC ETCH RATE | 1500 (Å/min) |
| UNIFORMITY | ±4.0 (%) |
| SIZE VARIATION | 0.00 μm (open) |
| | −0.01 μm (dense) |
| SELECTIVITY TO POLYSILICON FILM | ∞ |
| FOREIGN RESIDUE | NONE |

Compared with the tenth embodiment in which there were slight size variations, i.e., the organic bottom anti-reflective coating 44 was slightly smaller in size than the resist pattern 45, the slight variations were further reduced in the eleventh embodiment. When the organic bottom anti-reflective coating 44 is smaller in size than the resist pattern 45, the size of a pattern formed by etching the polysilicon film 43 masked with the resist pattern 45 and with the organic bottom anti-reflective coating 44 varies disadvantageously. However, there is no size variation in the pattern resulting from the polysilicon film 43 according to the eleventh embodiment.

The reason for no foreign residue in the eleventh embodiment may be that silicon contained in the organic bottom anti-reflective coating 44 is etched by Cl radicals contained in $Cl_2/O_2/SO_2$-based etching gas and there is no unreacted silicon component left.

The reason for reduced variations in the size of the organic bottom anti-reflective coating 44 may be the difficulty with which C as the main component of each of the resist pattern 45 and the organic bottom anti-reflective coating 44 reacts with S as the etchant to form $CS_2$ gas. Consequently, sidewall protecting films in the form of a polymer having C-S bonds are more likely to be attached to the respective sidewalls of the resist pattern 43 and the organic bottom anti-reflective coating 44, which suppresses a reduction in the size of the organic bottom anti-reflective coating 44.

EMBODIMENT 12

A twelfth embodiment performs a dry-etching step with respect to the organic bottom anti-reflective coating containing silicon by using etching gas composed of $Cl_2/SO_2/O_2$ gas and then plasma processing by using $N_2$ gas which is inert gas containing no S component.

The twelfth embodiment has also used the material of the organic bottom anti-reflective coating (CD9™ commercially available from Brewer Science Co., U.S.A.). The twelfth embodiment has also used the second dry etching apparatus shown in FIG. 3 and the film having the structure shown in FIG. 4 as a target film.

Conditions for the etching process according to the twelfth embodiment are as shown in Table 24. The results of quantitative analysis of S carried out by ion chromatography are as shown in Table 25.

TABLE 24

| CONDITIONS FOR ETCHING PROCESS | | |
| --- | --- | --- |
| | (1) STEP OF ARC ETCHING USING $SO_2$ GAS | (2) STEP OF REMOVING S-COMPONENT BY USING $N_2$ GAS |
| GAS | $Cl_2/SO_2/O_2$ = 10/10/20 (sccm) | $N_2$ = 100 (sccm) |
| ICP/RF | 13.56 (MHz) 300/70 (W) | 13.56 (MHz) 100/0 (W) |
| PRESSURE | 5 (mTorr) | 100 (mTorr) |
| TEMPERATURE OF LOWER ELECTRODE | 10 (° C.) | 10 (° C.) |
| SETTING OF ETCHING TIME | 60% OVER | 90 SECONDS |

TABLE 25

| COMBINATION OF STEPS | DETERMINATION OF S BY ION CHROMATOGRAPHY |
| --- | --- |
| STEP (1) ONLY | 160 μg/8-inch wafer |
| STEP (1) + STEP (2) | 30 μg/8-inch wafer |

As shown in Table 25, the result of quantitative analysis of S carried out by ion chromatography was 160 μg/8-inch wafer in the case where only the step (1) was performed, i.e., where only dry etching was performed with respective to the organic bottom anti-reflective coating 44 by using etching gas composed of $Cl_2/SO_2/O_2$ gas. By contrast, the result of quantitative analysis of S carried out by ion chromatography was 30 μg/8-inch wafer in the case where the steps of (1) and (2) were performed, i.e., where dry etching was performed with respect to the organic bottom anti-reflective coating 44 by using etching gas composed of $Cl_2/SO_2/O_2$ gas and then plasma processing was performed by using a plasma composed of $N_2$ gas without applying a bias voltage to the sample stage 23 as the lower electrode holding the silicon wafer 41 as a target material. Compared with the case where only the step (1) was performed, the amount of S was reduced significantly in the case where the steps (1) and (2) were performed.

Since etching gas contains the S component in the twelfth embodiment, the S component remains on the silicon wafer 41 after dry etching performed with respect to the organic bottom anti-reflective coating 44. The remaining S component may react with moisture contained in the atmosphere to generate residues.

However, if plasma processing is performed as in the twelfth embodiment by using $N_2$ gas without applying a bias voltage to the sample stage 23 holding the silicon wafer 41 after dry etching is performed with respect to the organic bottom anti-reflective coating 44 containing silicon by using $Cl_2/SO_2/O_2$ gas, it is remarkably effective in reducing residues since the S component remaining on the silicon wafer 41 is reduced significantly.

If plasma processing is performed by using $N_2$ gas with a bias voltage being applied to the sample stage 23 holding the silicon wafer 41, it is effective in reducing the remaining S component but a pattern collapse may occur in the upper portion of the resist pattern 45. This may be attributed to an excessive amount of $N^+$ ion component present in the upper portion of the resist pattern 45, which sputters the upper portion of the resist pattern 45.

If plasma processing is performed by using $N_2$ gas without applying a bias voltage to the sample stage 23, only a small amount of $N^+$ ion component is present in the upper portion of the resist pattern 45, which prevents the $N^+$ ion component from sputtering the upper portion of the resist pattern 45 and the occurrence of pattern collapse in the upper portion of the resist pattern 45.

Although the twelfth embodiment has performed plasma processing by using $N_2$ gas without applying a bias voltage to the sample stage 23, it is also possible to perform anode-coupling plasma processing instead.

Although the twelfth embodiment has used $N_2$ gas for plasma processing, similar effects can be achieved if $O_2$ gas, Ar gas, He gas, or the like is used instead.

Since the dry-etching step has been performed by using etching gas containing the S component, plasma processing is performed by using a plasma composed of $N_2$ gas containing no S component in the twelfth embodiment. Therefore, the conditions for plasma processing used in the twelfth embodiment, particularly for plasma processing performed without applying a bias voltage to the sample stage 23 and plasma processing performed by the anode coupling system, are also applicable to plasma processing performed in the fifth or sixth embodiment.

Although the tenth embodiment has used $Cl_2/O_2$-based etching gas and the eleventh and twelfth embodiments have used $Cl_2/SO_2/O_2$-based etching gas, similar effects can be achieved if $HBr/O_2$-based gas, $HBr/SO_2/O_2$-based gas, $CF_4/HBr/O_2$-based gas, or $CF_4/CHF_3/Ar/O_2$-based gas is used instead as etching gas.

Although each of the tenth to twelfth embodiments has used the second dry-etching apparatus in accordance with the ICP (Inductively Coupled Plasma) shown in FIG. 3, it will be appreciated that similar effects can also be achieved even when a dry-etching apparatus having a plasma source in accordance with RIE (Reactive Ion Etching), ECR (Electron Cyclotron Resonance), TCP (Transformer Coupled Plasma), LEP (Lissajous Electron Plasma), or like system is used.

We claim:

1. A pattern formation method comprising:
   a first step of depositing an organic bottom anti-reflective coating on an underlying film formed on a substrate;
   a second step of forming a resist pattern on said organic bottom anti-reflective coating; and
   a third step of performing dry etching with respect to said organic bottom anti-reflective coating masked with said resist pattern to form an anti-reflective coating pattern composed of said organic bottom anti-reflective coating, wherein
   said third step includes the step of performing dry etching by using etching gas containing gas having a S component to form said anti-reflective coating pattern such that said underlying film is not substantially etched.

2. A pattern formation method according to claim 1, wherein the etching gas used in said third step is $SO_2/O_2$-based gas.

3. A pattern formation method according to claim 2, wherein a ratio of $O_2$ to $SO_2$ in said $SO_2/O_2$-based gas is ½ or more.

4. A pattern formation method according to claim 2, wherein said third step includes the step of performing dry etching with said substrate held at a temperature of 15° C. or lower to form said anti-reflective coating pattern.

5. A pattern formation method according to claim 1, wherein the etching gas used in said third step contains carbonyl sulfide (COS).

6. A pattern formation method comprising:
   a first step of depositing an organic bottom anti-reflective coating on an underlying film formed on a substrate;
   a second step of forming a resist pattern on said organic bottom anti-reflective coating; and
   a third step of performing dry etching with respect to said organic bottom anti-reflective coating masked with said resist pattern to form an anti-reflective coating pattern composed of said organic bottom anti-reflective coating, wherein said third step includes:
   a pattern forming step of performing dry etching with respect to said organic bottom anti-reflective film by using etching gas containing gas having a S component, without etching said underlying film, to form said anti-reflective coating pattern; and
   a S-component removing step of removing the S component remaining on said substrate.

7. A pattern formation method according to claim 6, wherein said S-component removing step includes the step of performing plasma processing by using a plasma composed of gas containing no S component to remove the S component.

8. A pattern formation method according to claim 7, wherein said plasma processing is performed by an anode coupling system or by a system whereby no bias voltage is applied to an electrode holding said substrate.

9. A pattern formation method according to claim 7, wherein said plasma processing includes the step of setting a condition for plasma processing composed of at least one of gas pressure, a gas flow rate, temperature, high-frequency output, and a processing time in accordance with the degree of ruggedness of a surface of said underlying film and with the type of said underlying film.

10. A pattern formation method according to claim 6, wherein said S-component removing step includes the step of heating said substrate to remove the S component.

11. A pattern formation method according to claim 6, wherein said S-component removing step includes the step of washing said substrate to remove the S component.

12. A pattern formation method according to claim 6, wherein said S-component removing step includes the step of neutralizing an acidic deposit on said substrate with an alkaline solution and washing said substrate to remove the S component.

13. A pattern formation method according to claim 1, wherein the etching gas used in said third step contains only the S component and an O component.

* * * * *

(12) EX PARTE REEXAMINATION CERTIFICATE (5454th)
United States Patent
Ohkuni et al.

(10) Number: US 6,187,688 C1
(45) Certificate Issued: Jul. 18, 2006

(54) PATTERN FORMATION METHOD

(75) Inventors: Mitsuhiro Ohkuni, Nara (JP);
Shunsuke Kugo, Nagaokakyo (JP);
Tomoyuki Sasaki, Uji (JP); Kenji Tateiwa, Osaka (JP); Hideo Nikoh, Otsu (JP)

(73) Assignee: Matsushita Electric Industrial Co., Ltd., Kadoma (JP)

Reexamination Request:
No. 90/007,292, Nov. 23, 2004

Reexamination Certificate for:
Patent No.: 6,187,688
Issued: Feb. 13, 2001
Appl. No.: 09/142,252
Filed: Sep. 18, 1998

(22) PCT Filed: Dec. 4, 1997

(86) PCT No.: PCT/JP97/04455

§ 371 (c)(1),
(2), (4) Date: Sep. 18, 1998

(87) PCT Pub. No.: WO98/32162

PCT Pub. Date: Jul. 23, 1998

(30) Foreign Application Priority Data

Jan. 21, 1997 (JP) ............................. 9-008253
Jul. 15, 1997 (JP) ............................. 9-189579
Jul. 15, 1997 (JP) ............................. 9-189581

(51) Int. Cl.
*H01L 21/00* (2006.01)

(52) U.S. Cl. ............... 438/725; 438/735; 216/67; 216/72

(58) Field of Classification Search .......... 216/47, 216/49, 67, 72; 438/719, 720, 721, 725, 734, 438/735
See application file for complete search history.

(56) References Cited

U.S. PATENT DOCUMENTS 4,581,101 A * 4/1986 Senoue et al. ............ 438/706
5,447,598 A * 9/1995 Mihara et al. ............ 216/46
5,804,088 A * 9/1998 McKee .................... 216/47

FOREIGN PATENT DOCUMENTS

| JP | 01-307227 | 12/1989 |
| JP | 04-338630 | 11/1992 |
| JP | 06-138664 | 5/1994 |
| JP | 07-263425 | 10/1995 |
| JP | 08-111401 | 4/1996 |
| JP | 09-134862 | 5/1997 |

OTHER PUBLICATIONS

"Dry Etching of bottom–Anti–Reflective Coat", a. Nishizawa et al., Proc. of the 57th Applied Physics Scientific Lecture Meeting, 7a–T–1, Autumn 1996, p. 483.

"Low Temperature Etching of Orgnanic AC Layer", Jeon et al. Proc. of the 57th Applied Physics Scientific Lecture Meeting, 8a–T–7, Autumn 1996, p. 522.

* cited by examiner

*Primary Examiner*—Douglas McGinty

(57) ABSTRACT

After an organic bottom anti-reflective coating (12) is deposited on an underlying film (11), a resist pattern (15) is formed on the organic bottom anti-reflective coating (12). Dry etching is performed with respect to the organic bottom anti-reflective coating (12) masked with the resist pattern (15) to form an anti-reflective coating pattern. The dry-etching of the organic bottom anti-reflective coating (12) is performed by using etching gas containing gas having the S component such as $SO_2/O_2$-based etching gas or $COS/O_2$-based etching gas.

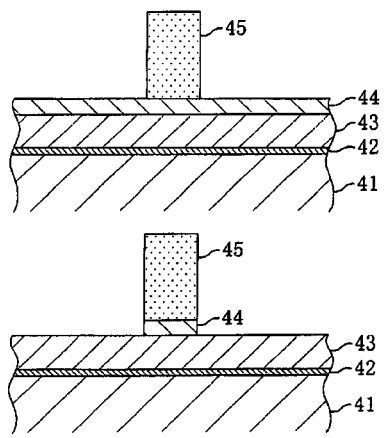

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–13 is confirmed.

* * * * *